United States Patent
Kameyama et al.

(10) Patent No.: US 8,184,024 B2
(45) Date of Patent: May 22, 2012

(54) DATA ENCODING PROCESS, DATA DECODING PROCESS, COMPUTER-READABLE RECORDING MEDIUM STORING DATA ENCODING PROGRAM, AND COMPUTER-READABLE RECORDING MEDIUM STORING DATA DECODING PROGRAM

(75) Inventors: Hiroaki Kameyama, Kawasaki (JP); Yuichi Sato, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 64 days.

(21) Appl. No.: 12/947,475

(22) Filed: Nov. 16, 2010

(65) Prior Publication Data
US 2011/0115654 A1 May 19, 2011

(30) Foreign Application Priority Data
Nov. 17, 2009 (JP) ................................. 2009-261649

(51) Int. Cl.
*H03M 7/40* (2006.01)
(52) U.S. Cl. ................................ 341/67; 341/50; 341/55
(58) Field of Classification Search .................... 341/55, 341/50, 67, 52, 106
See application file for complete search history.

(56) References Cited

U.S. PATENT DOCUMENTS

| | | | | |
|---|---|---|---|---|
| 4,491,934 A | * | 1/1985 | Heinz | 341/55 |
| 5,854,596 A | * | 12/1998 | Schouhamer Immink | 341/50 |
| 7,324,022 B2 | * | 1/2008 | Hayashi | 341/55 |
| 7,557,738 B2 | * | 7/2009 | Hunt | 341/55 |

FOREIGN PATENT DOCUMENTS

JP  2006-271006 A  10/2006

* cited by examiner

*Primary Examiner* — Peguy Jean Pierre
(74) *Attorney, Agent, or Firm* — Fujitsu Patent Center

(57) ABSTRACT

In a data encoding process: data is encoded by using unit bit series obtained from an encoding bit series; the encoding bit series is searched for a first bit series identical to a portion of the encoded data; the portion is substituted with a second bit series which includes a leading code indicating a leading position of a substitution range and position information indicating the position of the first bit series in the encoding bit series. In a data decoding process: the position information is detected from the substitution range in received data after the leading code is detected in the data; a substitution bit series is extracted from the position in the encoding bit series indicated by the position information; and the data in the substitution range is substituted with the substitution bit series so as to restore the encoded data.

20 Claims, 21 Drawing Sheets

Encoding Matrix A =

Encoded Data : × × × 1100111000101110 1× × × × × × × × × × × × 010101 × × ×

Compressed Data : × × × 110011110000010010000001001000010101001010 1× × ×

Leading Code — Row Number (17) — Bit-number Information (9) — Length Information (40)

FIG. 7

DATA ENCODING PROCESS, DATA DECODING PROCESS, COMPUTER-READABLE RECORDING MEDIUM STORING DATA ENCODING PROGRAM, AND COMPUTER-READABLE RECORDING MEDIUM STORING DATA DECODING PROGRAM

CROSS-REFERENCE TO RELATED APPLICATION

This application is based upon and claims the benefits of priority from the prior Japanese Patent Application No. 2009-261649, filed on Nov. 17, 2009, the entire contents of which are incorporated herein by reference.

FIELD

The embodiments discussed herein relate to a data encoding process, a data decoding process, a computer-readable recording medium storing a data encoding program, and a computer-readable recording medium storing a data decoding program.

BACKGROUND

File compression before transmission is a technique for substantially increasing the speed of file transmission through a network. If the size of a file to be transmitted is reduced by half by compression, the time needed for transmission is also reduced by half, so that the transmission speed is equivalently doubled.

For example, ZIP compression and the like are known as general file compression techniques. Such file compression techniques take advantage of the regularity of files. When data having low regularity such as a still or moving image is compressed, the compression rate is likely to be low, and the file size cannot be sufficiently reduced by the compression before transmission.

According to a first other technique for increasing the speed of file transmission, files are cached on the receiver side. In this case, the network traffic can be reduced by preventing repeated transmission of identical data. According to a second other technique, for example, a transmitter transmits only data indicating the difference from a previously transmitted file, and a receiver restores a desired file from the data indicating the difference and the previously transmitted file. However, neither of the first and second techniques achieves the effect of reducing the volume of transmitted data when a file is first transmitted, although the effect can be achieved when frequently updated files are transmitted or when a file is transmitted to more than one destination.

Incidentally, in many cases where high reliability is required in data transmission in an IP (Internet Protocol) network, TCP (transmission control protocol) transmission is performed. In TCP transmission, when a receiver receives a packet from a transmitter, the receiver returns a receipt acknowledgement signal, which is denoted by ACK. When the transmitter receives the ACK signal, the transmitter transmits the next packet. When the ACK signal is not returned (for example, because of packet loss), the transmitter retransmits the same packet. Since the above procedure is performed in TCP transmission, packets are received by receivers with high reliability. However, in the above procedure, when the transmitter and the receiver are distanced through a network, the round trip time (RTT) of data increases, so that the effective transmission rate decreases.

On the other hand, in UDP (User Datagram Protocol) transmission, each transmitter transmits packets without receiving the receipt acknowledgement signal from a receiver. Therefore, UDP transmission can achieve higher effective transmission rates than TCP transmission, although TCP transmission is superior to UDP transmission in communication reliability.

Further, in a technique proposed for increasing communication reliability in non-procedure communication in which no operation for confirmation of transmission is performed as in UDP transmission, transmitted data are encoded so that errors can be corrected on the receiver side even when a packet is lost. For example, in a technique which is disclosed in Japanese Laid-open Patent Publication No. 2006-271006, source data is divided into m data pieces, and a result of an exclusive OR operation of one or more of the m data pieces each corresponding to a "1" bit in each of n m-bit data series is obtained and transmitted together with the corresponding data series, where the result of the exclusive OR operation and the corresponding data series constitute a set of encoded data.

However, in the techniques in which data to be transmitted is encoded so as to enable a receiver to perform error correction, the encoded data become voluminous, so that the data transmission rate is substantially lowered. In addition, even in other data encoding techniques, as well as the above techniques, reduction in the volume of encoded data by use of an efficient procedure is demanded.

SUMMARY

According to an aspect of the present invention, a computer-readable recording medium which stores a data encoding program to be executed by a computer, the data encoding program makes the computer execute a process comprising: obtaining encoded data from data to be encoded and unit bit series which is obtained from an encoding bit series (bit series for use in encoding); searching the encoding bit series for a first bit series identical to a portion of the encoded data; and substituting the portion of the encoded data with a second bit series, where the second bit series is a combination of a leading code and position information, the leading code indicates the leading position of a substitution range, and the position information indicates the position of the first bit series in the encoding bit series.

The objects and advantages of the invention will be realized and attained by means of the elements and combinations particularly pointed out in the claims.

It is to be understood that both the forgoing general description and the following detailed description are exemplary and explanatory and are not restrictive of the invention, as claimed.

BRIEF DESCRIPTION OF DRAWINGS

FIG. 7 illustrates operations for compression according to the second embodiment;

DESCRIPTION OF EMBODIMENTS

The embodiments will be explained below with reference to the accompanying drawings, wherein like reference numbers refer to like elements throughout.

1. First Embodiment

Figure 1:
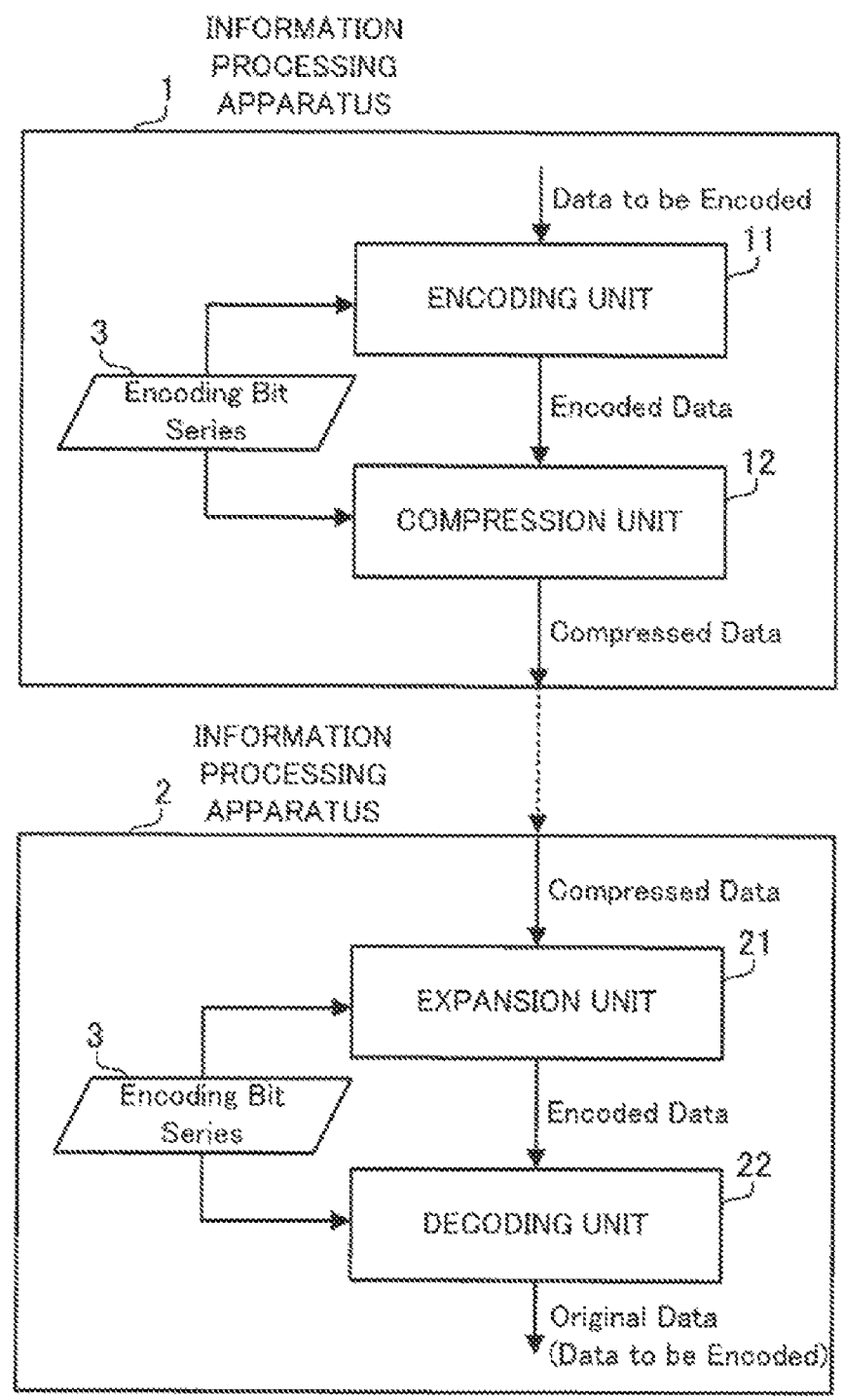
FIG. 1 illustrates constructions of an information processing apparatuses according to a first embodiment.

FIG. 1 illustrates constructions of an information processing apparatuses according to the first embodiment. The information processing apparatus illustrated in FIG. 1 comprises an encoding unit 11 and a compression unit 12. The encoding unit 11 encodes data to be encoded, by use of an encoding bit series (e.g., a bit series for use in encoding) 3. The compression unit 12 compresses the encoded data outputted from the encoding unit 11, by use of the same encoding bit series 3. The information processing apparatus 2 illustrated in FIG. 1 comprises an expansion unit 21 and a decoding unit 22. The expansion unit 21 expands the compressed (encoded) data outputted from the compression unit 12, by use of the encoding bit series 3. The decoding unit 22 decodes the expanded (encoded) data outputted from the expansion unit 21, by use of the same encoding bit series 3. The used bit series is common to the encoding and the compression by the information processing apparatus 1 and expansion and the decoding by the information processing apparatus 2.

Each of the information processing apparatuses 1 and 2 can be realized by a computer. The functions of each of the information processing apparatuses 1 and 2 can be realized when a CPU (central processing unit) which the information processing apparatus 1 or 2 has executes a predetermined program.

The compressed data outputted from the compression unit 12 is passed to the information processing apparatus 2, for example, through a network or a portable storage medium. The information processing apparatus 1 may further comprise the functions of the expansion unit 21 and the decoding unit 22 in the information processing apparatus 2. In this case, for example, the compressed data outputted from the compression unit 12 may be temporarily stored in a storage medium, and be then read out from the storage medium to be supplied to the expansion unit 21.

The encoding unit 11 in the information processing apparatus 1 generates encoded data from data to be encoded and unit bit series obtained from the encoding bit series 3. The compression unit 12 searches the encoding bit series 3 for a first bit series which is identical to a portion of the encoded data generated by the encoding unit 11. Then, the expansion unit 21 substitutes the portion of the encoded data with a second bit series, where the second bit series is a combination of a leading code and position information, the leading code indicates the leading position of a substitution range, and the position information indicates the position of the first bit series in the encoding bit series 3. Thus, the encoded data is compressed, i.e., the volume of the encoded data is reduced.

The encoding bit series 3 may be prepared, for example, in the form of a matrix. In this case, each of the unit bit series may be realized by, for example, one row of the matrix or a portion of one row of the matrix. The position information may be, for example, information indicating the row number of the matrix, or information indicating both of the row number of the matrix and the bit number from the leading bit of the row.

The above information processing apparatus 1 can suppress the volume of the encoded data by the simple procedure in which a portion of the encoded data identical to a bit series contained in the encoding bit series is substituted with other information. In addition, since the encoding bit series 3 is used by the encoding and the compression in common, for example, it is unnecessary to prepare data dedicated to the compression. Therefore, the volume of the encoded can be efficiently reduced. Further, when the encoded data is transmitted, the effective transmission rate of the encoded data can be increased.

Furthermore, the information represented by the second bit series with which the portion of the encoded data is substituted may further include, for example, length information indicating the length of the bit series of the portion of the encoded data. As a result, the number of bits constituting the bit series for which the encoding bit series 3 is searched can be varied, and can be specifically increased, so that the compression rate can be raised.

On the other hand, the information processing apparatus 2 restores the encoded data by detecting the substitution range (in which the portion of the encoded data is substituted with the leading code and the position information by the compression unit 12) from the compressed data inputted into the information processing apparatus 2, and substituting the bits in the detected range with the original bit series. Specifically, when the expansion unit 21 detects the leading code (indicating the leading position of the substitution range) from the compressed data, the expansion unit 21 extracts the position information from the substitution range, and then extracts a substitution bit series from the position in the encoding bit series 3 indicated by the extracted position information. The bit series extracted from the encoding bit series 3 is the bit series which is identical to the portion of the encoded data and for which the encoding bit series 3 is searched when the compression unit 12 compresses the encoded data. The expansion unit 21 substitutes the bits (representing the leading code and the position information) in the substitution range in the compressed data, with the extracted bit series.

Further, in the case where the length information is included in the substitution range in the compressed data, the expansion unit 21 extracts as the substitution bit series a bit series having a bit length indicated by the length information, from the position in the encoding bit series 3 indicated by the position information.

The decoding unit 22 restores the aforementioned data to be encoded, from the encoded data restored by the expansion unit 21 and unit bit series obtained from the encoding bit series 3.

Since the encoding bit series 3 used in the processing for decoding is also used in the processing for expansion for restoring the encoded data, it is unnecessary to prepare data dedicated to the processing for expansion. In addition, the processing for expansion can be performed in a reverse procedure to the aforementioned processing for compression, i.e., by a simple operation of substituting a portion of compressed data with a bit series contained in the encoding bit series 3.

Incidentally, the processing for encoding to be performed by the encoding unit 11 can be realized by an operation which adds a function enabling error correction to data to be encoded. In this case, the respective functions of the information processing apparatuses 1 and 2 perform the following operations.

Specifically, the encoding unit 11 performs a calculation by combining data pieces of the data to be encoded and the unit bit series cut out from the encoding bit series 3, where the data pieces are each constituted by a predetermined number of bits, and the unit bit series are each constituted by an identical number of bits. Then, the encoding unit 11 includes in the encoded data the result of each calculation and the position information which indicates the position, in the encoding bit series 3, of the unit bit series used in each calculation. Hereinafter, the position information indicating the position, in the encoding bit series 3, of the unit bit series used in each calculation and being included in the encoded data may be referred to as the first position information or a unit-bit-series position indicator.

The calculation performed on the data piece and the unit bit series may be, for example, an exclusive OR calculation or OR calculation according to each bit constituting the unit bit series. The OR calculation may be performed, for example, in accordance with a set of simultaneous equations.

Alternatively, the unit bit series per se, instead of the first position information, may be included in the encoded data. It is possible to determine which of the first position information and the unit bit series per se is to be included in the encoded data, for example, according to the size of the encoded data which is generated. That is, either of the first position information and the unit bit series per se which makes the size of the generated encoded data smaller can be included in the encoded data.

The compression unit 12 performs the following operations for compression on each of calculation-result containing regions in the encoded data outputted from the encoding unit 11. Each of the calculation-result containing regions contains a result of a calculation performed by using a unit bit series and one or more data pieces. Specifically, the compression unit 12 searches the encoding bit series 3 for a bit series identical to a partial bit series in each calculation-result containing region (an arbitrary bit series as a part of the bits constituting each calculation-result containing region). When the bit series identical to the partial bit series is found in the encoding bit series 3, the compression unit 12 substitutes the partial bit series with at least the leading code indicating the leading position of the substitution range and position information indicating the position, in the encoding bit series 3, of the bit series for which the encoding bit series 3 is searched. Hereinafter, the position information with which the partial bit series is substituted is referred to as the second position information.

For example, in the case where the compressed data outputted from the compression unit 12 are transmitted to the information processing apparatus 2, the compressed data corresponding to each of the calculation-result containing regions may be contained in a packet to be transmitted. In this case, the information processing apparatus 2 receives the packet and can easily acquire data corresponding to each calculation-result containing region from the received, compressed data. In addition, for example, in the case where the compressed data is passed to the information processing apparatus 2 through a portable storage medium, the compressed data may be stored in the portable storage medium having sections corresponding to the respective calculation-result containing regions.

Further, in addition to the result of the calculation performed by using the one unit bit series and the one or more data pieces, each of the calculation-result containing regions may contain the one unit bit series used in the calculation producing the calculation result or a unit-bit-series position indicator indicating the one unit bit series. Alternatively, the unit bit series used in the calculation or the unit-bit-series position indicator may be contained in a region other than the region containing the calculation result. In this case, the unit bit series used in the calculation or the unit-bit-series position indicator in the region does not undergo the processing for compression performed by the compression unit 12, and data outputted from the encoding unit 11 are stored in the region as they are.

When the expansion unit 21 detects the leading code and the second position information corresponding to the leading code in the compressed data inputted into the information processing apparatus 2, the expansion unit 21 extracts a substitution bit series from the position in the encoding bit series 3 which is indicated by the detected second position information. Then, the expansion unit 21 expands the compressed data by substituting the compressed region in the inputted compressed data containing the leading code and the second position information which are detected as above, with the substitution bit series extracted from the encoding bit series 3.

For each of the plurality of the calculation-result containing regions, the decoding unit 22 extracts, from the encoded data obtained by the expansion performed by the expansion unit 21, a plurality of unit-bit-series position indicators (as the first position information) for more than one unit bit series, extracts the more than one unit bit series from the encoding bit series 3 on the basis of the first position information, and decodes the encoded data by use of the extracted unit bit series. Specifically, the decoding unit 22 extracts from the expanded, encoded data the first position information and the aforementioned results of the calculations performed in the processing for encoding. (As mentioned before, the calculations in the processing for encoding are performed on the basis of the aforementioned data pieces of the data to be encoded and the unit bit series, and the data pieces are each constituted by a predetermined number of bits.) For each of the plurality of the calculation-result containing regions, the decoding unit 22 restores the data pieces by performing a calculation using the unit bit series (extracted from the encoding bit series 3 on the basis of the first position information or the unit-bit-series position indicators) and the above results of the calculations (performed in the processing for encoding on the basis of the aforementioned data pieces of the data to be encoded and the unit bit series). Alternatively, in the case where the unit bit series per se, instead of the first position information, are contained in the encoded data, the decoding unit 22 can directly extract the unit bit series from the encoded data without reference to the encoding bit series 3.

Further, in the calculations in the processing for decoding, for example, exclusive OR operations are performed between rows in a first matrix and a second matrix, where the first matrix is formed by arraying bits of a plurality of unit bit series in a matrix arrangement, and the second matrix is formed by arraying bits of the calculation results obtained on the basis of the plurality of unit bit series and each group of one or more data pieces. Alternatively, in the case where a set of simultaneous equations is used in the processing for encoding, the calculations in the processing for decoding may be a calculation for obtaining values of variables corresponding to each data piece by substituting the plurality of unit bit series and each of the extracted calculation results into the set of simultaneous equations.

In the case where the above encoding and decoding are performed, even when a portion of data is lost after generation of the compressed data until input into the expansion unit 21, processing for error correction is realized by the decoding. Therefore, the original data to be encoded can be normally restored in many cases where the encoding and decoding are performed as above.

Further, the volume of transferred data can be reduced by compressing the data to be encoded after the data to be encoded is encoded. Therefore, for example, in the case where data is transferred through a network, it is possible to increase the effective transmission rate while maintaining the reliability of the data transfer. In addition, even in the case where data is transferred through a portable storage medium, the speed at reading from and writing into the portable storage medium can be increased.

Hereinafter, other embodiments are explained in detail, where compressed data are transferred through a network, and an encoding bit series in the form of an encoding matrix is used. In the embodiments explained below, processing for encoding in which a function for error correction is added to data to be encoded is performed in an apparatus arranged on the transmitter side.

2. Second Embodiment

2.1 System Configuration

Figure 2:
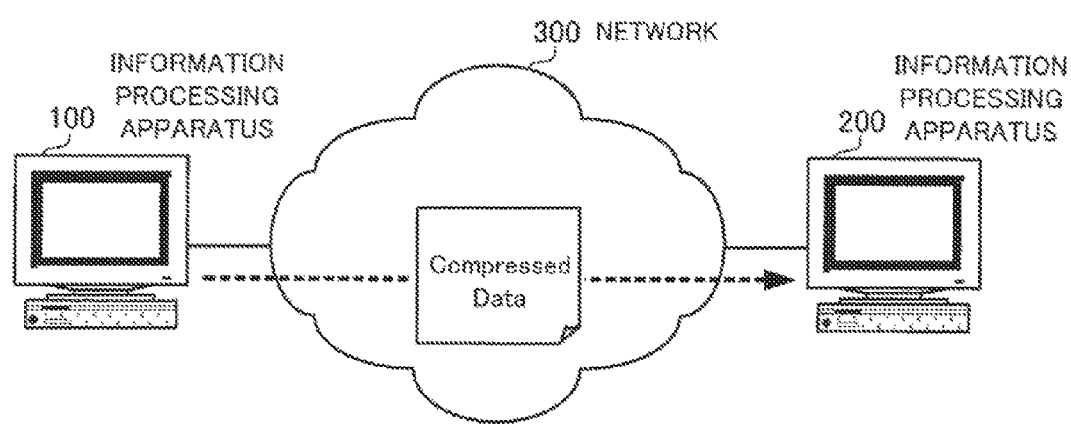
FIG. 2 illustrates an example of a configuration of a communication system according to a second embodiment.

FIG. 2 illustrates an example of a configuration of a communication system according to the second embodiment. In the configuration of FIG. 2, data are transmitted between the information processing apparatuses 100 and 200 through the network 300. In the data transmission, the information processing apparatus on the transmitter side encodes data to be transmitted, compresses the encoded data, and transmits the compressed data to the information processing apparatus on the receiver side. Since the data to be transmitted is encoded before transmission, the data to be transmitted is converted into such a form that processing for restoration of the original data can be performed on the receiver side even when a portion of the transmitted data is lost on the network 300. Specifically, the information processing apparatus on the receiver side receives the compressed data, expands the compressed data into the encoded data, and decodes the encoded data. In the decoding, processing for error correction is performed on the basis of other encoded data which is received. Therefore, even when a portion of the transmitted data is lost, the original data to be transmitted can be restored in many cases.

In the present embodiment, data are packetized when the data are transmitted between the information processing apparatuses 100 and 200. Since the function of error correction is performed as above, the reliability of data transmission can be improved even in the case where a non-procedure communication protocol, according to which reception of data is not confirmed, is used. In the present embodiment, it is assumed that UDP is used as a non-procedure communication protocol.

Since a non-procedure communication protocol is used, the effective transmission rate is high compared with the case where a communication protocol (e.g., TCP) according to which reception of data is confirmed is used. However, the volume of data to be transmitted is increased by the processing for encoding the data to be transmitted. Therefore, according to the present embodiment, the volume of the transmitted data is reduced by compressing the encoded data by use of the encoding matrix used in the encoding. Since the data to be transmitted is encoded and compressed at the present embodiment, both the effective transmission rate and the reliability of the data transmission are improved.

2.2 Hardware Construction of Image Processing Apparatus

Figure 3:
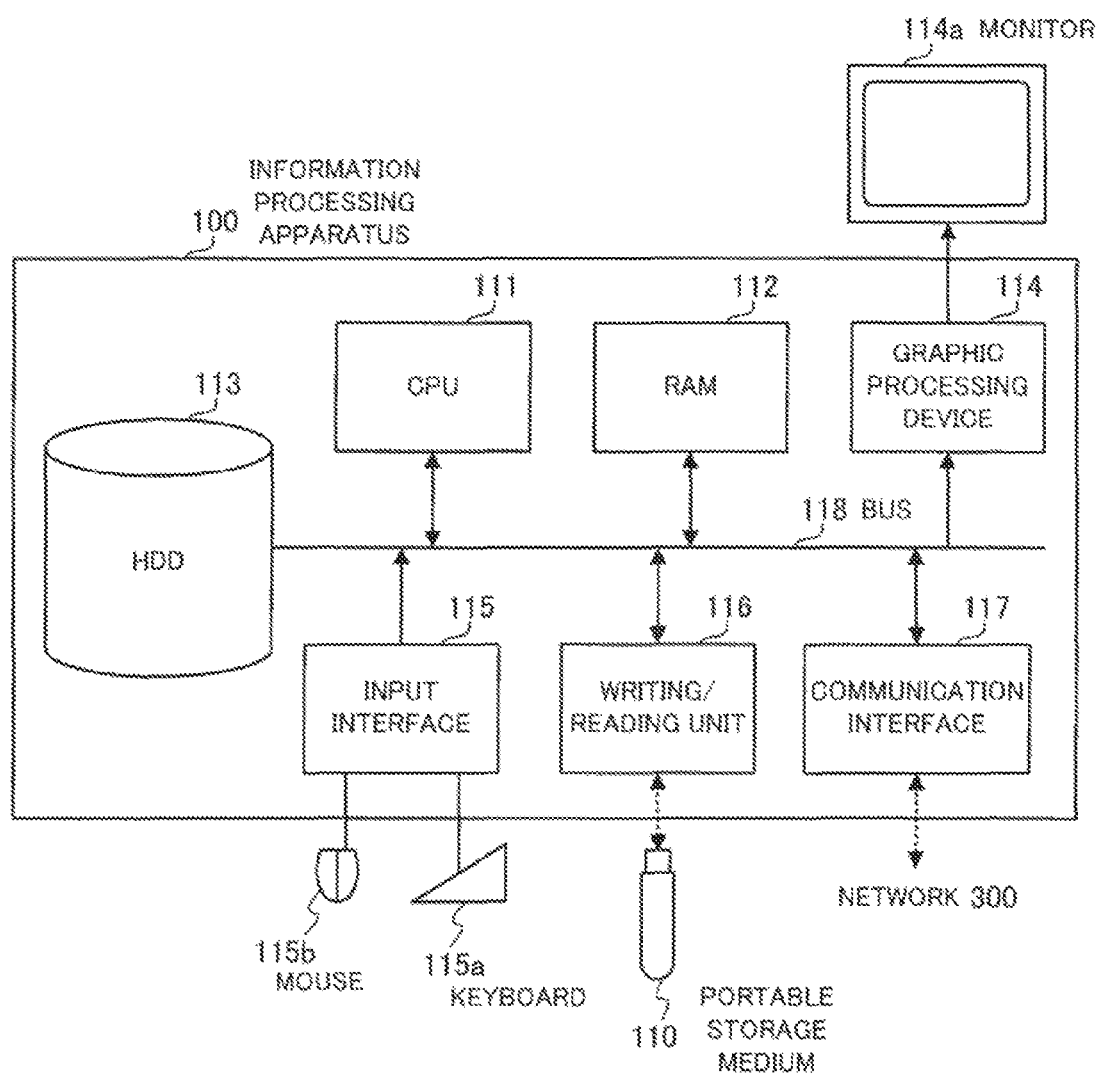
FIG. 3 illustrates an example of a hardware construction of an information processing apparatus according to the second embodiment.

The information processing apparatus 100 can be realized by a computer having a hardware construction, for example, as illustrated in FIG. 3. The computer of FIG. 3 comprises a CPU (central processing unit) 111, a RAM (random access memory) 112, an HDD (hard disk drive) 113, a graphic processing device 114, an input interface 115, a writing/reading unit 116, and a communication interface 117, which are interconnected through a bus 118. The CPU 111 collectively controls the entire image processing apparatus 100 by executing various programs stored in storage mediums such as the HDD 113. The RAM 112 temporarily stores at least portions of the programs which are executed by the CPU 111, as well as various types of data necessary for processing in accordance with the programs. The HDD 113 stores the programs which are executed by the CPU 111, as well as various types of data necessary for program execution by the CPU 111.

A monitor 114a is connected to the graphic processing device 114, which makes the monitor 114a display an image on a screen of the monitor 114a in accordance with an instruction from the CPU 111. For example, a keyboard 115a and a mouse 115b are connected to the input interface 115, which transmits signals sent from the keyboard 115a and the mouse 115b, to the CPU 111 through the bus 118.

The writing/reading unit 116 writes in a portable storage medium 110 data received from the CPU 111 through the bus 118, reads data from the portable storage medium 110, and transmits the data read from the portable storage medium 110, to the CPU 111 through the bus 118. The portable storage medium 110 may be, for example, an optical disk, a flexible disk (FD), and a semiconductor memory connected through a USB (universal serial bus) interface. The communication interface 117 transmits and receives data to and from an external device such as the information processing apparatus 200 through the network 300.

Further, the information processing apparatus 200 can also be realized by a hardware construction similar to the information processing apparatus 100.

2.3 Functions of Image Processing Apparatuses

Figure 4:
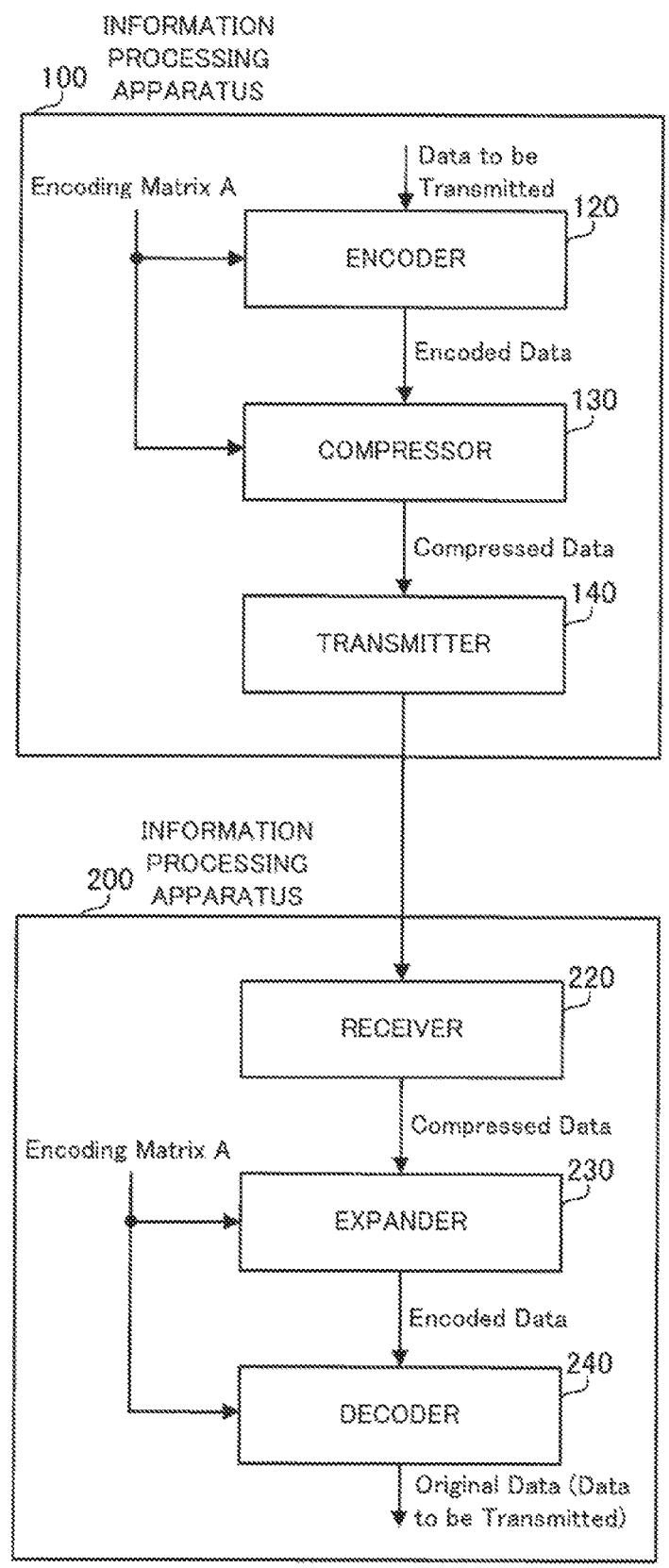
FIG. 4 illustrates functions of information processing apparatuses according to the second embodiment, which are respectively arranged on a transmitter side and a receiver side.

The functions and operations performed for data transmission according to the second embodiment are explained below. FIG. 4 illustrates the functions of the information processing apparatuses 100 and 200 according to the second embodiment. In the following explanations, it is assumed that the information processing apparatus 100 is arranged on the transmitter side, and the information processing apparatus 200 is arranged on the receiver side.

The information processing apparatus 100 comprises an encoder 120, a compressor 130, and a transmitter 140. The encoder 120 encodes data to be transmitted, the compressor 130 compresses the encoded data, and the transmitter 140 transmits the compressed data to the network 300. The functions of the encoder 120, the compressor 130, and the transmitter 140 are realized by execution of a predetermined program by the CPU 111 in the information processing apparatus 100.

The encoder 120 encodes the data to be transmitted, by use of an encoding matrix A having n rows and m columns (where n and m are integers satisfying $n \geq m$). The same encoding matrix A is also used in the processing for expansion and the processing for decoding performed by the information processing apparatus 200. In the following explanations, for example, selection of a bit series $a_x$ in the x-th row in the encoding matrix A means selection of a bit series from the $(x \times m)$-th bit to the $((x+1) \times m-1)$-th bit of the encoding matrix A.

The encoder 120 successively selects each group of m data pieces of the data to be transmitted, where each of the data pieces has a predetermined number of bits. At this time, the encoder 120 also selects n bit series respectively arranged in the rows of the encoding matrix A, for each group of m data pieces selected as above. The bit series arranged in each row of the encoding matrix A is an example of the aforementioned unit bit series in the first embodiment.

The encoder 120 brings the bits of each of the n bit series selected as above into correspondence with the m data pieces, respectively. Then, the encoder 120 selects from each group of m data pieces one or more data pieces each corresponding to a "1" bit in the bit series, and performs an exclusive OR calculation on the selected one or more data pieces. Hereinafter, the result of the above exclusive OR calculation is referred to as exclusive OR data, and in particular, the result of the above exclusive OR calculation obtained for each of the n bit series and each group of m data pieces is referred to as a set of exclusive OR data.

The encoder 120 combines a row number indicating the position of the row of each bit series in the encoding matrix A and a set of exclusive OR data calculated by use of the bit series. Hereinafter, the combined set of the row number and the set of exclusive OR data is referred to as a set of redundant data. The encoder 120 generates a set of redundant data for each of the n selected bit series. Finally, the encoder 120 generates sets of redundant data for the entire data to be transmitted, by performing the above operations on the entire data to be transmitted, and outputs the sets of redundant data as encoded data.

The row numbers and the sets of exclusive OR data may not be contained in the encoded data in the above manner. For example, the encoded data may contain the row number of each of the n bit series and a plurality of sets of exclusive OR data obtained by use of the bit series from the entire data to be transmitted so that the plurality of sets of exclusive OR data obtained by use of the bit series from the entire data to be transmitted immediately follow the row number of the bit series. However, in this case, the row numbers in the encoded data do not undergo the following processing for compression performed by the compressor 130.

The compressor 130 acquires each set of redundant data in the encoded data outputted from the encoder 120, and searches the encoding matrix A for a bit series identical to an arbitrary bit series contained in the set of redundant data. When the bit series identical to the arbitrary bit series is found in the encoding matrix A, the compressor 130 substitutes the bit series for which the encoding matrix A is searched, with information containing at least a leading code and position information. The leading code indicates the leading position of a substituted range (i.e., a range in which the bit series is substituted) in the set of redundant data, and the position information indicates the position, in the encoding matrix A, of the bit series identical to the arbitrary bit series, and contains, for example, a row number in the encoding matrix A and the bit number from the leading bit of the row corresponding to the row number. The information with which the bit series is substituted may further contain length information indicating the length of the substituted bit series. The length information may be contained in the information with which the bit series is substituted, for example, in the case where the length of the bit series for which the encoding matrix A is searched is variable in the processing for compression.

The transmitter 140 packetizes the compressed data outputted from the compressor 130, and transmits the compressed data to the network 300. According to the present embodiment, the transmitter 140 packetizes the compressed data in accordance with UDP, and each packet contains compressed data corresponding to a set of redundant data. Incidentally, the processing for substitution performed by the compressor 130 can reduce the size of the redundant data, so that the length of each packet can vary according to the size of the redundant data outputted from the compressor 130.

The information processing apparatus 200 on the receiver side comprises a receiver 220, an expander 230, and a decoder 240. The receiver 220 receives packets from the network, and outputs the compressed data to the expander 230. The expander 230 expands the compressed data into encoded data, and outputs the encoded data. The decoder 240 decodes the encoded data into the original data to be transmitted, and outputs the original data (i.e., the data to be transmitted). The functions of the receiver 220, the expander 230, and the decoder 240 are realized by execution of a predetermined program by a CPU in the information processing apparatus 200.

The receiver 220 extracts compressed data from packets received through the network 300. As mentioned before, compressed data corresponding to a set of redundant data can be extracted from each packet.

The expander 230 searches the extracted compressed data for the leading code. When the leading code is found, the expander 230 extracts the position information from the data immediately following the leading code. Then, the expander 230 reads out a partial bit series having a predetermined length from the position indicated by the position information in the encoding matrix A, and substitutes the leading code and the position information with the partial bit series.

The decoder 240 successively extracts, from the encoded data obtained by the expansion by the expander 230, each portion of the encoded data corresponding to m data pieces. Then, the decoder 240 extracts the row numbers and the exclusive OR data from the extracted encoded data. Subsequently, the decoder 240 reads out each bit series in a row of the encoding matrix A on the basis of the row number, and arranges the values of the bits in the bit series in a first matrix and the values of the exclusive OR data corresponding to the bit series in a second matrix. Thereafter, the decoder 240 transforms the first matrix into an identity matrix, performs a similar operation on the corresponding second matrix, and outputs as the m (unencoded) data pieces the value in each row in the second matrix after the above operation.

2.4 Operations on Transmitter Side

Hereinbelow, the operations performed by the information processing apparatuses 100 and 200 are explained in more detail. First, the operations performed by the information processing apparatus 100 are explained below with reference to FIGS. 5 to 9.

2.4.1 Example of Encoding

Figure 5:
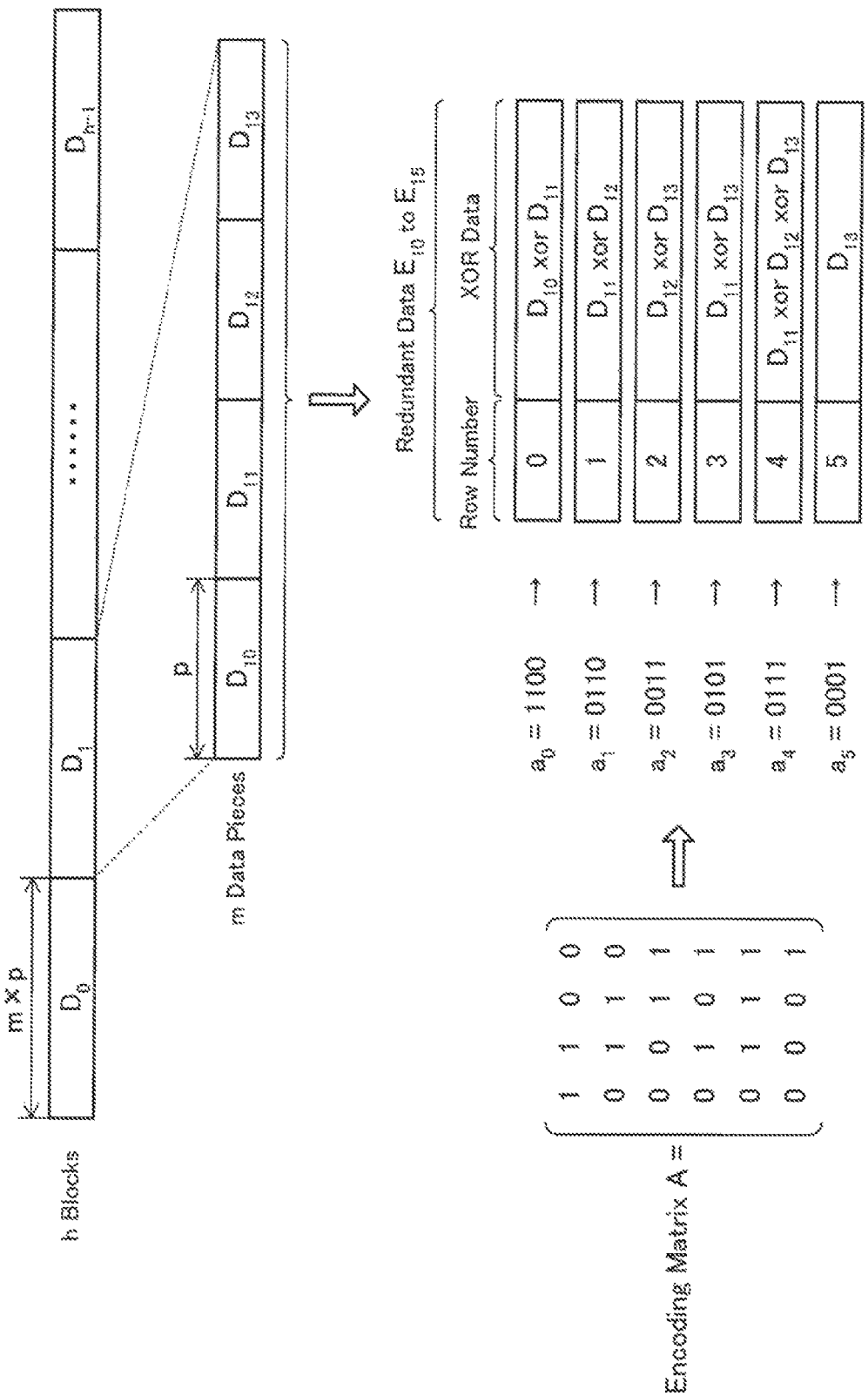
FIG. 5 illustrates operations for encoding according to the second embodiment.

First, the processing for encoding performed by the information processing apparatus 100 on the transmitter side is explained with reference to FIG. 5, which illustrates operations for encoding according to the second embodiment. Although the number m of the columns of the encoding matrix A is the small number "4" in the following example for simple explanation, in the practical systems, it is desirable that the number m of the columns is a great value (e.g., a number corresponding to several bytes). In addition, the number n of the rows of the encoding matrix A is 6. Further, in the example of FIG. 5, the data to be transmitted is first divided into blocks each having the size of m×p bits, where p is an integer equal to or greater than one, and each block is then divided into m data pieces each having the size of p bits. In the example of FIG. 5, it is assumed that the data to be transmitted is divided into h blocks $D_0, D_1, \ldots, D_{h-1}$, where h is an integer equal to or greater than one. The value p can be determined, for example, on the basis of the size of data contained in each packet outputted from the transmitter 140.

In particular, FIG. 5 illustrates details of encoding of the block $D_1$ as an example. In this example, the encoder 120 divides the block $D_1$ into four data pieces $D_{10}, D_{11}, D_{12}$, and $D_{13}$, and selects bit series in m or more rows in the encoding matrix A. In the example of FIG. 5, the six bit series $a_0, a_1, a_2, a_3, a_4$, and $a_5$ are selected. The encoder 120 brings the first to fourth bits of each of the selected bit series $a_0, a_1, a_2, a_3, a_4$, and $a_5$ into correspondence with the four data pieces $D_{10}, D_{11}, D_{12}$, and $D_{13}$, respectively. Then, the encoder 120 selects one or more of the data pieces $D_{10}, D_{11}, D_{12}$, and $D_{13}$ respectively corresponding to each "1" bit in each of the selected bit series $a_0, a_1, a_2, a_3, a_4$, and $a_5$, performs an exclusive OR calculation on the one or more selected data pieces to produce a set of exclusive OR data, and combines the set of exclusive OR data with the row number of the bit series which is used for obtaining the set of exclusive OR data is produced, so as to produce a set of redundant data.

For example, since the bit series $a_0$ is "1100" in the illustrated example, the data pieces $D_{10}$ and $D_{11}$ are selected on the basis of the bit series $a_0$, and an exclusive OR calculation is performed on the data pieces $D_{10}$ and $D_{11}$, so that the encoder 120 outputs a set $E_{10}$ of redundant data in the form of a bit series produced by a combination of the row number "0" and the set of exclusive OR data obtained from the data pieces $D_{10}$ and $D_{11}$. Similarly, since the bit series $a_1$ is "0110" in the illustrated example, the data pieces $D_{11}$ and $D_{12}$ are selected on the basis of the bit series a1, and an exclusive OR calculation is performed on the data pieces $D_{11}$ and $D_{12}$, so that the encoder 120 outputs a set $E_{11}$ of redundant data in the form of a bit series produced by a combination of the row number "1" and the set of exclusive OR data obtained from the data pieces $D_{11}$ and $D_{12}$. Further, since the bit series $a_5$ is "0001" in the illustrated example, only the data piece $D_{13}$ is selected on the basis of the bit series $a_5$. In this case, the data piece $D_{13}$ per se is outputted as the result of an exclusive OR calculation performed on the data piece $D_{13}$ (as a set of exclusive OR data), so that the encoder 120 outputs a set $E_{15}$ of redundant data in the form of a bit series produced by a combination of the row number "5" and the set of exclusive OR data obtained from the data piece $D_{13}$.

When operations similar to the above are performed for all the blocks $D_0, D_1, \ldots, D_{h-1}$, 6×h sets $E_{00}, E_{01}, \ldots, E_{(h-1)5}$ of redundant data are generated, and a bit series in which the 6×h sets $E_{00}, E_{01}, \ldots, E_{(h-1)5}$ of redundant data are combined is outputted as encoded data.

Alternatively, the number n of bit series used for obtaining the exclusive OR data may be smaller than the number of rows of the encoding matrix A, as far as the number n of bit series used for obtaining the exclusive OR data is equal to or greater than the number m of the data pieces in each group. In addition, each of the bit series selected from the encoding matrix A may be a portion of a row of the encoding matrix A. For example, in the case where the number of rows of the encoding matrix A is greater than the number n of bit series used for obtaining the exclusive OR data, and the number of columns in the encoding matrix A is greater than the number m of the data pieces used for obtaining the exclusive OR data, each of the bit series used for obtaining the exclusive OR data may be a bit series constituted by m bits ranging from the leading bit of a row of the encoding matrix A.

2.4.2 Sequence of Operations for Encoding

Figure 6:
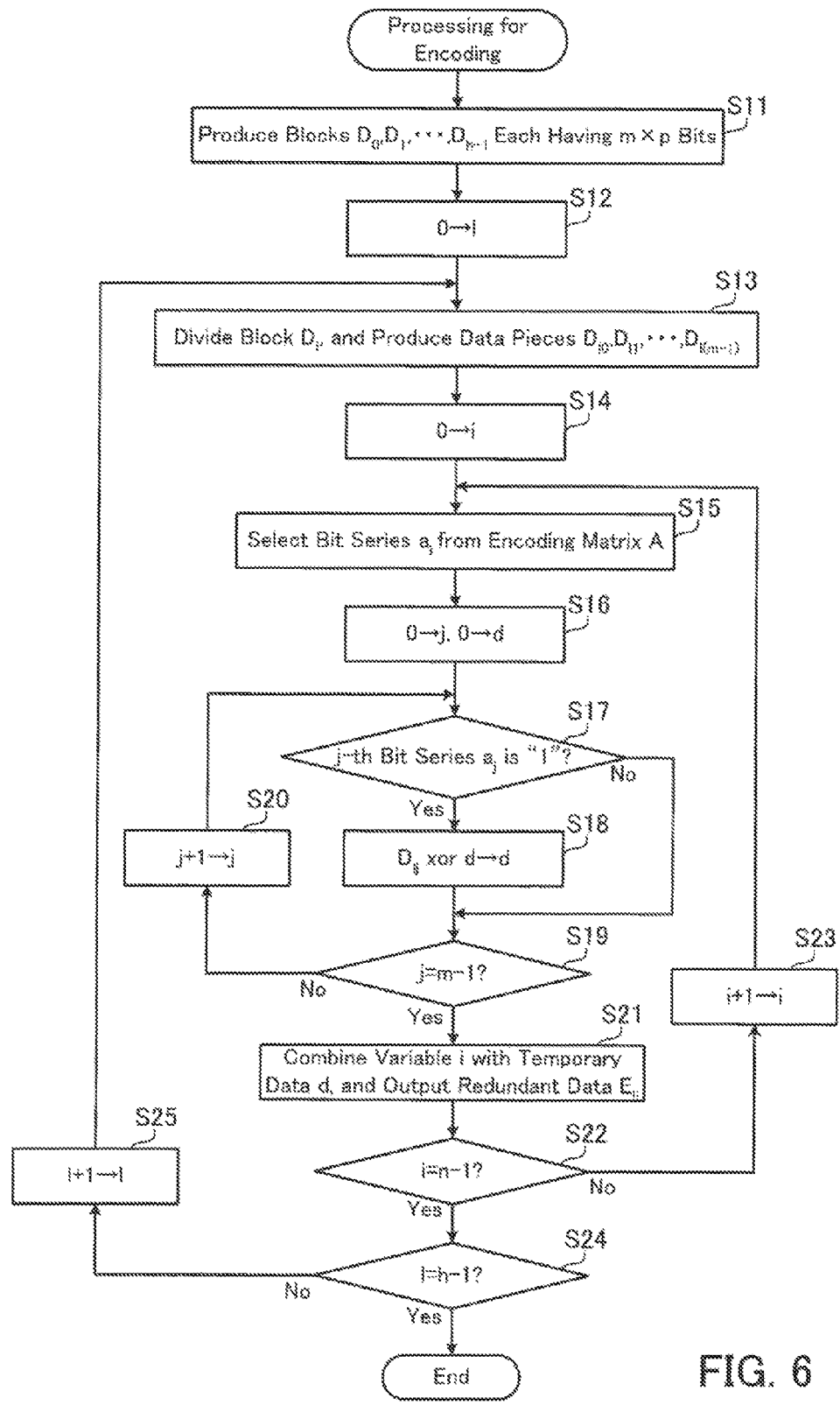
FIG. 6 indicates a flow of processing performed by an encoder according to the second embodiment.

FIG. 6 indicates a flow of processing for encoding performed by the encoder 120 according to the second embodiment.

<Step S11> The encoder 120 divides data to be transmitted, into blocks each having the size of m×p bits. As in the aforementioned example, m is the number of columns of the encoding matrix A, and p is the size of each of the data pieces. In the following explanations, h blocks $D_0, D_1, \ldots, D_{h-1}$ are obtained by the above division of the data to be transmitted. In the case where the division of the data to be transmitted produces remainder data having the size smaller than m×p bits, the remainder data may not be encoded, and may be attached to the end of the redundant data generated by the processing for encoding, which is explained later.

<Step S12> The encoder 120 assigns "0" to the variable 1.

<Step S13> The encoder 120 selects the block $D_1$ from the h blocks $D_0, D_1, \ldots, D_{h-1}$, and generates m data pieces $D_{10}, D_{11}, \ldots, D_{1(m-1)}$ each having the identical size of p bits.

<Step S14> The encoder 120 assigns "0" to the variable i.

<Step S15> The encoder 120 selects a bit series $a_1$ in the i-th row in the encoding matrix A.

<Step S16> The encoder 120 assigns "0" to the variable j and temporary data d.

<Step S17> The encoder 120 determines whether or not the value $a_{ij}$ of the j-th bit in the bit series $a_i$ is "1". When yes is determined in step S17, the operation goes to step S18. When the value $a_{ij}$ of the j-th bit in the bit series $a_i$ is "0", the operation goes to step S19.

<Step S18> The encoder 120 calculates an exclusive OR of the j-th data piece and the temporary data d, and assigns the calculation result to the temporary data d.

<Step S19> The encoder 120 determines whether or not the variable j is equal to m−1. When yes is determined in step S19, the operation goes to step S21. When the variable j is smaller than m−1, the operation goes to step S20.

<Step S20> The encoder 120 increments the variable j by one, and the operation goes to step S17. Thus, the operations in steps S17 to S19 are repeated m times until the variable j increased from "0" reaches m−1, so that the value of the temporary data d is updated according to the data piece corresponding to each "1" bit of the selected bit series $a_i$.

<Step S21> The encoder 120 combines the value of the variable i indicating the current row number with the current value of the temporary data d, and generates the i-th set $E_{li}$ of redundant data for the block $D_1$.

<Step S22> The encoder 120 determines whether or not the value of the variable i is equal to n−1. When yes is determined in step S22, the operation goes to step S24. When the value of the variable i is smaller than n−1, the operation goes to step S23.

<Step S23> The encoder 120 increments the variable i by one, and thereafter performs the operation in step S15. Thus, the operations in step S15 to S21 are repeated n times, so that the sets $E_{10}, E_{11}, \ldots, E_{1(n-1)}$ of redundant data respectively corresponding to the n bit series selected from the encoding matrix A are generated.

<Step S24> The encoder 120 determines whether or not the value of the variable 1 is equal to h−1. When the value of the variable 1 is smaller than h−1, the operation goes to step S25. When the value of the variable 1 is equal to h−1, h times repetition of the operations in steps S13 to S24 is completed, so that the h×q sets $E_{00}, E_{01}, \ldots, E_{(h-1)(n-1)}$ of redundant data are outputted. Thus, the processing of FIG. 6 is completed.

<Step S25> The encoder 120 increments the variable 1 by one, and the operation goes to step S13, in which the next block is selected and m data pieces are generated. Then the operations in steps S14 to S22 are performed for the next block.

In the above processing of FIG. 6, after the h blocks are produced in step S11, the data pieces are produced by selecting the h blocks one by one in step S13. Alternatively, it is possible to successively produce data pieces directly from the data to be transmitted, in units of m data pieces, without producing the blocks.

Further, although the value of the variable i indicating the row number and the temporary data d are contained in a set of redundant data in step S21 in the above processing of FIG. 6, alternatively, the corresponding bit series per se, instead of the variable i, may be contained in the set of redundant data. However, unless the number of bit series used in the encoding is extremely large, the data size is smaller when the variable i is contained in the set of redundant data than when the corresponding bit series per se is contained. In addition, even in the case where the bit series corresponding to the variable i is contained in a region of a set of redundant data, the region of the set of redundant data is certainly substituted with the position information and the like in the subsequent processing for compression. Therefore, it is considered that the containing of the variable i is normally advantageous in the processing efficiency.

According to the processing for encoding explained above, even when a portion of data received by the information processing apparatus 200 is lost, in many cases, the original data to be transmitted can be restored by decoding the received data after expansion. The possibility of successful restoration, in the decoding, of the data to be transmitted can be increased by increasing the number n of rows in the encoding matrix A used in the processing. However, when the numerical values in the encoding matrix A are chosen so that a matrix formed of arbitrary m rows can be easily transformed into an identity matrix, it is possible to reduce the number n of rows in the encoding matrix A and the volume of the encoded data while increasing the possibility of successful restoration, in the decoding, of the data to be transmitted.

2.4.3 Example of Compression

Next, the processing for compression is explained with reference to FIG. 7, which illustrates operations for compression according to the second embodiment.

The compressor 130 searches the encoding matrix A for a bit series identical to a bit series having a predetermined length and being contained in each set of redundant data outputted from the encoder 120. When the identical bit series is found in the encoding matrix A, the compressor 130 substitutes the bit series contained in the set of redundant data, with a leading code, position information, and length information. Thus, the volume of the redundant data is reduced, i.e., the redundant data is compressed.

In the example of FIG. 7, the leading code is "11110", and the position information (which indicates the position of the bit series in the encoding matrix A identical to the bit series in the set of redundant data) contains a row number expressed by 10 bits and bit-number information indicating the bit position counted from the leading bit of each row and being expressed by 10 bits. Specifically, the position information in FIG. 7 indicates the ninth bit in the seventeenth row. Further, the length information is expressed by 10 bits, and indicates "40."

Figure 8:
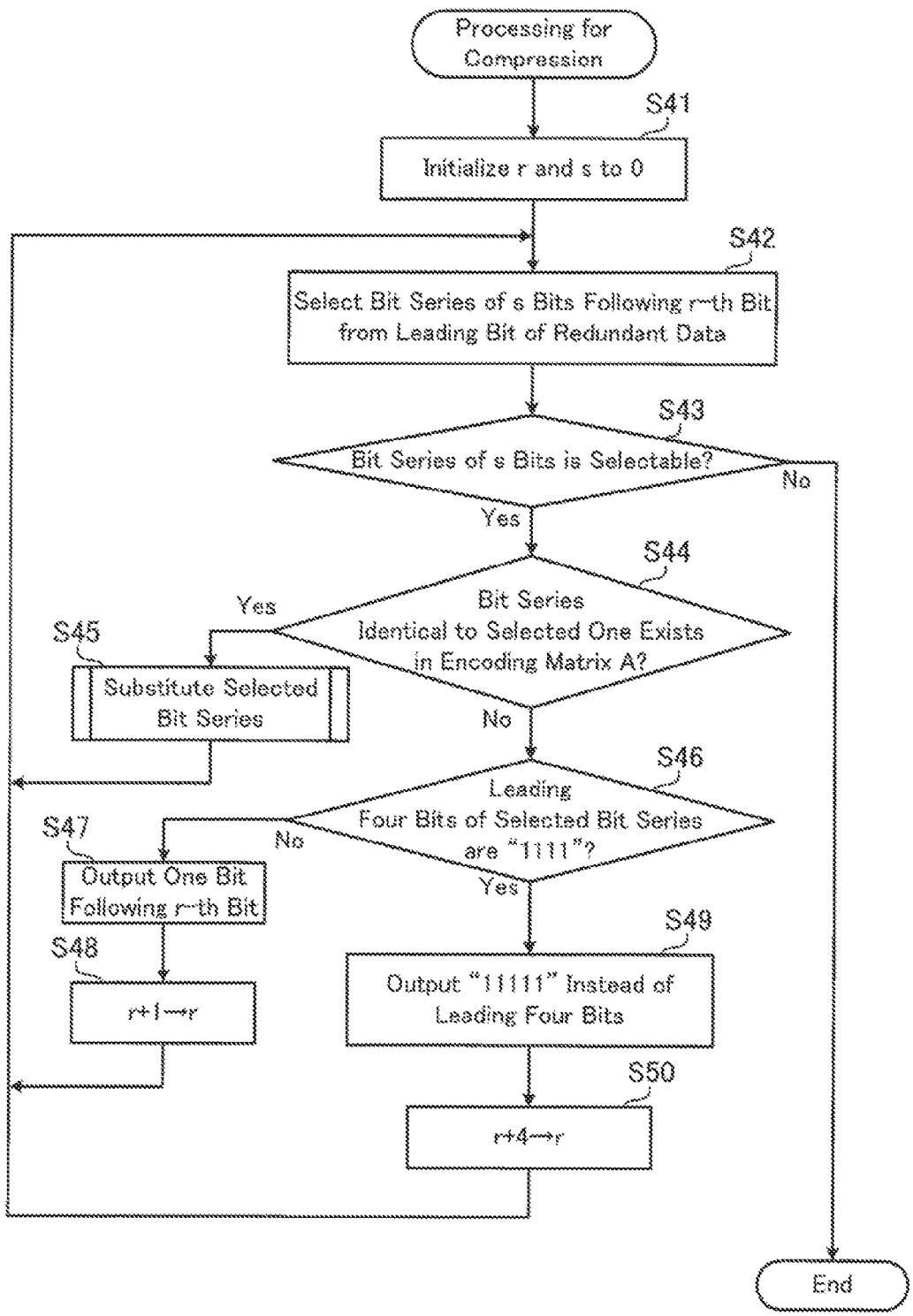
FIG. 8 indicates a flow of processing performed by a compressor according to the second embodiment.

The number of bits constituting the bit series in the redundant data for which the encoding matrix A is searched may be variable, for example, as illustrated in FIG. 8. Alternatively, the number of bits constituting the bit series in the redundant data for which the encoding matrix A is searched may be fixed. In the latter case, it is unnecessary to include in the compressed data the information on the length of the bit series.

Incidentally, since the compressed data contains the leading code, the information processing apparatus 200 on the receiver side can determine the compressed region of the received data. Therefore, if a bit series identical to the leading code is contained in the uncompressed region of the encoded data, the information processing apparatus 200 can erroneously determine, during the processing for expansion, that the region following the bit series is compressed. In order to overcome this problem, the compressor 130 extracts a portion of the encoded data in which such an erroneous determination can be made, and substitutes the extracted portion with another bit series which does not cause an erroneous determination.

2.4.4 Sequence of Operations for Compression

FIG. 8 indicates a flow of processing for compression performed by the compressor 130 according to the second embodiment. The processing of FIG. 8 is repeatedly performed every time the compressor 130 acquires a set of redundant data.

<Step S41> The compressor 130 assigns "0" to the variable r, and a predetermined initial value to the variable s. The initial value of the variable s can be set to a value between the number of the consecutive "1" bits ranging from the leading bit of the leading code and the number of bits constituting each set of redundant data. Since the leading code is "11110" in this example, the initial value of the variable s is set to a value equal to or greater than four.

<Step S42> The compressor 130 performs an operation for selecting a bit series of s consecutive bits from the r-th bit from the leading bit of the set of redundant data outputted from the encoder 120.

<Step S43> The compressor 130 determines whether or not the bit series of s bits is successfully selected in step S42. When yes is determined in step S43, the operation goes to step S44. When the number of consecutive bits from the r-th bit from the leading bit of the set of redundant data to the end of the set of redundant data is smaller than s, the compressor 130 cannot select the bit series of s bits, and therefore terminate the processing for compression.

<Step S44> The compressor 130 searches the encoding matrix A for a bit series identical to the bit series selected in step S42. In this example, the search is made by scanning the encoding matrix A along the row direction. When the identical bit series is found in the encoding matrix A, the operation goes to step S45. When the identical bit series does not exist in the encoding matrix A, the operation goes to step S46.

<Step S45> The compressor 130 performs processing for substituting the region of the set of redundant data containing the bit series selected in step S42, with the leading code, position information, and length information. At this time, the leading code "11110" is arranged at the leading position of the substituted range. Details of the processing in step S45 are explained later with reference to FIG. 9. In addition, as explained later, the processing in step S45 increases the variable r by the number of the substituted bits. Thereafter, the operation goes to step S42.

<Step S46> The compressor 130 determines whether or not the leading four bits of the bit series selected in step S42 are "1111". When yes is determined in step S46, the operation goes to step S49. When no is determined in step S46, the operation goes to step S47.

<Step S47> The compressor 130 outputs as a portion of compressed data the r-th bit from the leading bit of the set of redundant data.

<Step S48> The compressor 130 increments the variable r by one, and thereafter the operation goes to step S42.

<Step S49> The compressor 130 outputs a discrimination code "11111" instead of the leading four bits "1111" of the bit series selected in step S42.

<Step S50> The compressor 130 adds to the variable r the number "4" of the leading four bits, and thereafter the operation goes to step S42.

In the above processing of FIG. 8, the bit series of s consecutive bits are selected from the set of redundant data in step S42. Then, when a bit series identical to the bit series selected in step S42 is found in the encoding matrix A, the portion of the set of redundant data is substituted in step S45. At this time, the leading code "11110" is arranged at the leading position of the substituted region. Thereafter, the operations from step S42 are performed on another portion of the set of redundant data which ranges from the bit following the region already substituted as above.

When a bit series identical to the bit series selected in step S42 is not found in the encoding matrix A, it is determined, in step S46, whether or not the leading four bits of the selected bit series of s bits are "1111", which are leading four bits of the leading code. When yes is determined, the leading four bits "1111" of the selected bit series of s bits are substituted with the discrimination code "11111" in step S49. Thereafter, the operations from step S42 are performed on the portion of the set of redundant data which ranges from the bit following the above leading four bits "1111". On the other hand, when the leading four bits of the selected bit series of s bits are not identical to "1111", the operations from step S42 are performed on another portion of the set of redundant data which is one bit shifted backward from the leading bit of the above bit series of s bits.

In the processing described above, the leading four bits "1111" of the selected bit series of bits are substituted with the discrimination code "11111" in step S49. Therefore, the leading four bits of the discrimination code "11111" are identical to the leading four bits of the leading code "11110". However, the fifth bit of the discrimination code "11111" is different from the fifth bit of the leading code.

For example, in the case where the encoded data before compression contains a bit series identical to the leading code "11110", the bit series "11110" is substituted with the bit series "111110" according to the above processing. Further, in the case where the encoded data before compression contains a bit series "11111", the bit series "11111" is substituted with the bit series "111111" according to the above processing. Therefore, when the compressed data corresponding to redundant data is scanned from the top, and a bit series "11110" is found, the bit series is certainly recognized to be the leading code. In addition, when five consecutive "1" bits are found by scanning of the compressed data corresponding to a set of redundant data from the top, the bit series is certainly recognized to be the discrimination code. That is, when the compressed data undergoes expansion, the leading code and the discrimination code can be discriminated with high reliability.

The values of the leading code and the discrimination code are not limited to the values in the above example. However, the values of the leading code and the discrimination code are identical in a plurality of leading bits, and different in the bit following the plurality of leading bits. As described above, when the above identical series of the plurality of leading bits is found in the encoded data, the identical series of the plurality of leading bits in the encoded data is substituted with the discrimination code.

Figure 9:
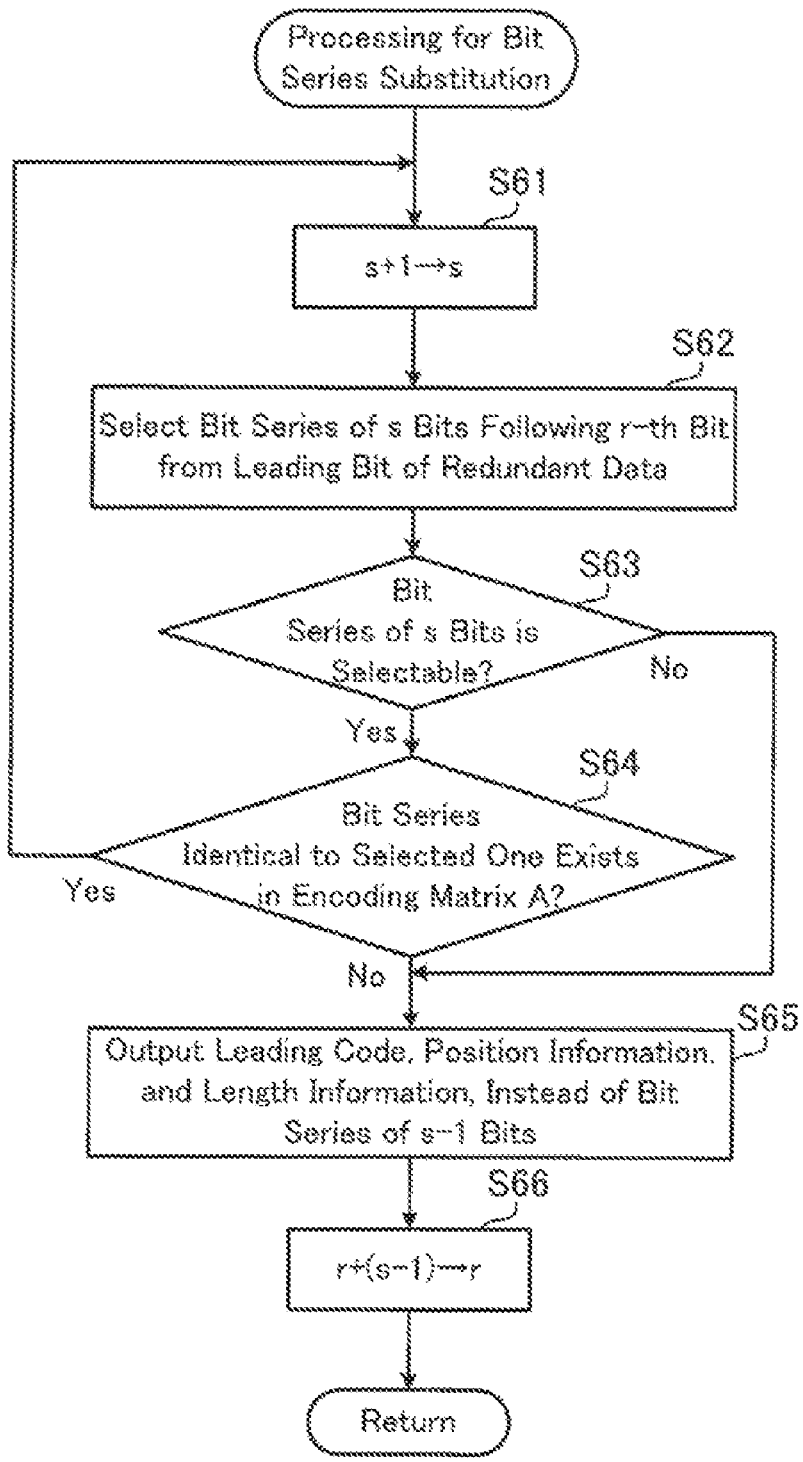
FIG. 9 indicates a sequence of operations performed for substitution of bit series in step S45 in FIG. 8.

FIG. 9 indicates a sequence of operations performed for substitution of bit series in step S45 in FIG. 8.

<Step S61> The compressor 130 increments the variable s by one.

<Step S62> The compressor 130 performs an operation for selecting a bit series of s consecutive bits ranging from the r-th bit from the leading bit of the set of redundant data.

<Step S63> The compressor 130 determines whether or not the bit series of s bits is successfully selected in step S62. When yes is determined in step S63, the operation goes to step S64. When the compressor 130 cannot select the bit series of s bits, the operation goes to step S65.

<Step S64> The compressor 130 searches the encoding matrix A for a bit series identical to the bit series selected in step S62. When the identical bit series is found, the operation goes to step S61. When the identical bit series does not exist in the encoding matrix A, the operation goes to step S65.

<Step S65> The compressor 130 substitutes the bit series of s−1 consecutive bits ranging from the r-th bit from the leading bit of the set of redundant data, with the leading code "11110", position information, and length information, and outputs the substituted data as compressed data. The position information indicates the leading position of the bit series for which the encoding matrix A is searched in step S44 (or in step S64), and contains the row number of the bit series in the encoding matrix A and the bit-number information indicating the bit position counted from the leading bit of each row. The length information has the value of s−1.

<Step S66> The compressor 130 adds s−1 to the variable r, and thereafter the operation goes to step S42.

In the loop of steps S61 to S64 in FIG. 9, the operations of incrementing by one the bit length of the bit series in the set of redundant data for which the encoding matrix A is searched, and determining whether or not a bit series identical to the bit series in the set of redundant data being searched for and having the incremented length is found in the encoding matrix A are repeated until a bit series identical to the bit series in the set of redundant data being searched for and having the incremented length becomes unable to be found in the encoding matrix A. Thus, the encoding matrix A is searched for a bit series identical to the longest possible bit series in the set of redundant data, and the longest possible bit series in the set of redundant data is substituted with the leading code, the position information, and the length information, so that the compression rate of the compressed data can be increased.

In the case where the variable s (indicating the number of bits constituting the bit series to be searched for) is fixed, it is unnecessary to include the length information in the compressed data. In this case, the processing of FIG. 9 is not performed in step S45, and the region of the set of redundant data containing the bit series selected in step S42 is simply substituted with the leading code and the position information. Thereafter, the fixed value s is added to the variable r, and then the operation goes to step S42.

Although, in the above processing for compression, the encoding matrix A is scanned along the row direction for searching for a bit series identical to the bit series contained in the set of redundant data, the scanning direction is not limited to the row direction. For example, the encoding matrix A may be scanned along the column direction or an oblique direction. Further, the encoding matrix A may be scanned along one of a plurality of directions. In this case, compressed data corresponding to a set of redundant data can be correctly expanded when the direction information indicating one of the plurality of directions along which the set of redundant data is scanned is contained in the compressed data.

After the compressed data is produced by the processing explained above, the transmitter 140 packetizes the compressed data in accordance with UDP so that the compressed data corresponding to each set of redundant data is contained in a packet, and transmits the packet to the information processing apparatus 200 through the network 300.

2.5 Operations on Receiver Side

Next, the operations performed by the information processing apparatus 200 on the receiver side are explained below with reference to FIGS. 10 to 16.

2.5.1 Sequence of Operations for Expansion

Figure 10:
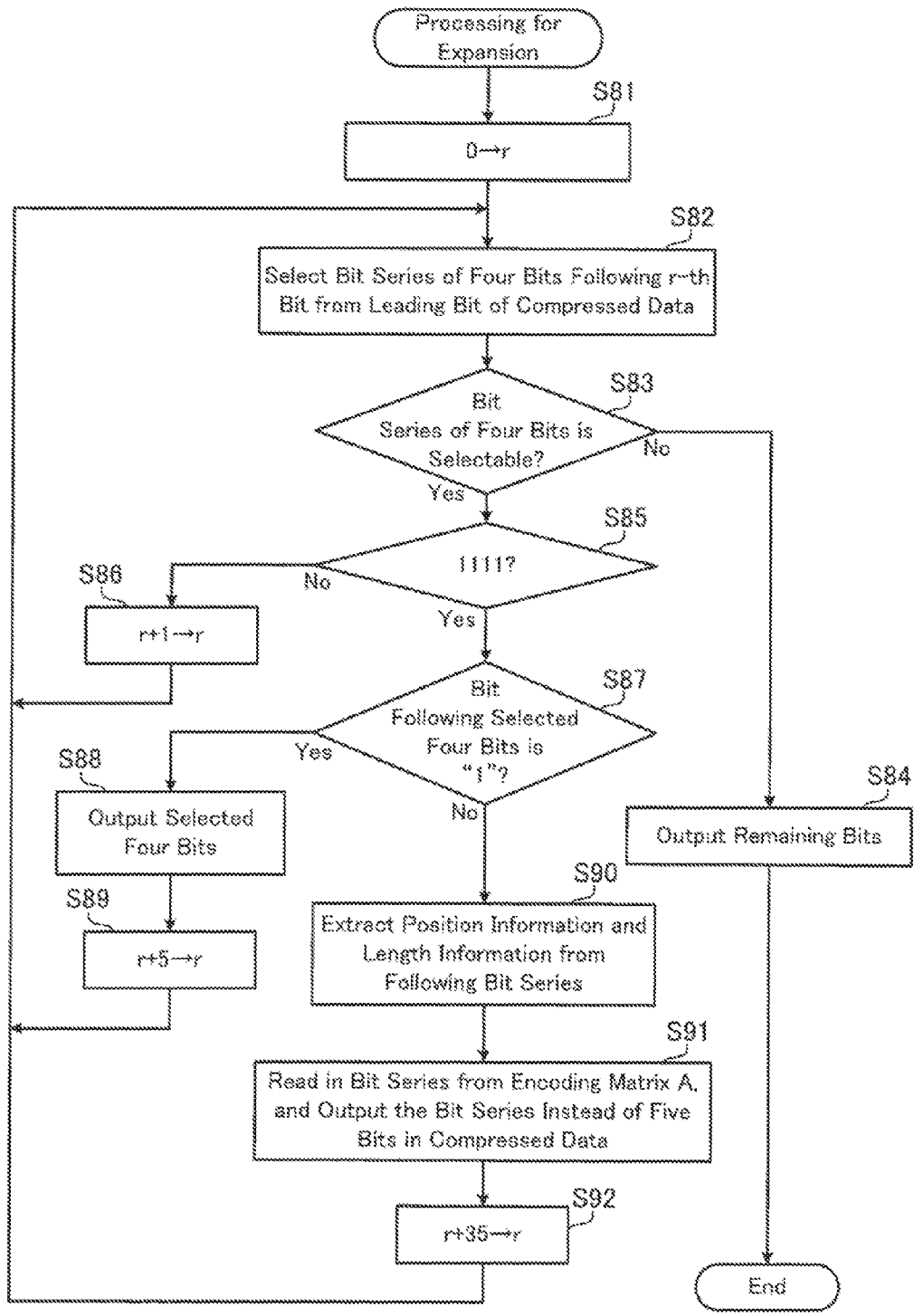
FIG. 10 indicates a flow of processing performed by an expander according to the second embodiment.

FIG. 10 indicates a flow of processing for expansion performed by the expander 230 according to the second embodiment. In the information processing apparatus 200, the receiver 220 receives packets from the network, extracts compressed data from the packets, and outputs the compressed data to the expander 230. As explained before, the packets contain the compressed data corresponding to the sets of redundant data, respectively. The receiver 220 extracts compressed data corresponding to a set of redundant data from each of the received packets, and supplies the extracted compressed data to the expander 230.

The expander 230 receives from the receiver 220 the compressed data in units corresponding to the sets of redundant data. Then, the expander 230 restores the encoded data by expanding the compressed data by reference to the encoding matrix A, which is stored in advance in a storage medium such as an HDD. The processing of FIG. 10 is performed, for example, every time the expander 230 reads in the compressed data corresponding to a set of redundant data.

<Step S81> The expander 230 assigns "0" to the variable r.

<Step S82> The expander 230 performs an operation for selecting a bit series of four bits ranging from the r-th bit from the leading position of the compressed data corresponding to the set of redundant data.

<Step S83> The expander 230 determines whether or not the bit series of four bits can be successfully selected in step S82. When yes is determined in step S83, the operation goes to step S85. When no is determined in step S83, the operation goes to step S84.

<Step S84> The expander 230 outputs as encoded data the bit series ranging from the above r-th bit as it is, because when no is determined in step S83, the number of bits ranging from the r-th bit to the end of the compressed data is smaller than four. In this case, the bit series ranging from the above r-th bit ranging to the end of the compressed data is not compressed. After the above bit series ranging from the above r-th bit is outputted, the processing of FIG. 10 is completed.

<Step S85> The expander 230 determines whether or not the bit series selected in step S82 is "1111". When yes is determined in step S85, the operation goes to step S87. When no is determined in step S85, the operation goes to step S86.

<Step S86> The expander 230 increments the variable r by one, and thereafter the operation goes to step S82. Since no is determined in step S85, the four bits selected in step S82 do not coincide with the leading four bits of the leading code. Therefore, it is possible to consider that at least the first bit of the bit series selected in step S82 is not a bit belonging to the bit series with which a portion of encoded data is substituted in the aforementioned processing for compression. Thus, in order to search for the leading position of the leading code or the discrimination code, the leading position of the bit series in the compressed data subject to the determination in steps S83, S85, and S87 is shifted forward by one bit, and then the operations from step S82 are performed on the bit series of the four bits ranging from the shifted leading position.

<Step S87> The expander 230 determines whether or not the bit following the bit series of four bits selected in step S82 is "1". When yes is determined in step S87, the operation goes to step S88. When the bit following the bit series of four bits selected in step S82 is "0", the operation goes to step S90.

<Step S88> The expander 230 outputs as encoded data a bit series of the four bits selected in step S82.

<Step S89> The expander 230 adds five to the variable r, and thereafter the operation goes to step S82.

Thus, when the operations in step S87 and S88 are performed, the "1" bit following the bit series selected in step S82 is removed, so that the original bit series "1111" is restored.

<Step S90> The expander 230 determines that the data represented by the five bits ranging from the r-th bit from the leading position of the compressed data corresponding to the set of redundant data is the leading code. Therefore, the expander 230 extracts the position information and the length information from the bit series of 30 bits following the bit subject to the determination in step S87 (i.e., the 30 bits following the leading code).

<Step S91> The expander 230 reads in from the encoding matrix A a bit series determined on the basis of the extracted position information and length information. Specifically, the expander 230 determines a row in the encoding matrix A on the basis of the row number contained in the position information, and further determines a bit number counted from the leading position of the determined row on the basis of the bit-number information contained in the position information. Then, the expander 230 reads in a bit series which ranges from the position corresponding to the bit number and has the number of bits indicated by the length information. Further, the expander 230 outputs as encoded data the bit series which is read in as above, instead of the bit series of the five bits ranging from the r-th bit from the leading position of the compressed data corresponding to the set of redundant data.

<Step S92> The expander 230 adds the value "35" to the variable r, where the value "35" is the total number of bits of the leading code, the position information, and the length information. Thereafter, the operation goes to step S82.

When the operations in step S90 and S91 are performed, the original bit series which is substituted with the leading code, the position information, and the length information in the processing for compression is restored. Then, when the operation in step S92 is performed, a bit series of four bits following the restored bit series becomes the next bit series subject to the operations from step S82.

Although, in step S91 in the above processing for expansion, the bit series is read along the row direction of the encoding matrix A, the direction along which the bit series is read is not limited to the row direction. For example, the bit series may be read along the column direction or an oblique direction. In this case, the direction along which the bit series is read is agreed on in advance between the information processing apparatuses 200 and 100. Further, as described before, the direction along which the bit series is read may be variable. In this case, the direction information indicating the direction along which the bit series is read is contained in a predetermined region following the leading code in the compressed data, and the expander 230 reads the bit series having the bit length indicated by the length information, along the direction indicated by the direction information.

2.5.2 Example of Decoding

Figure 11:
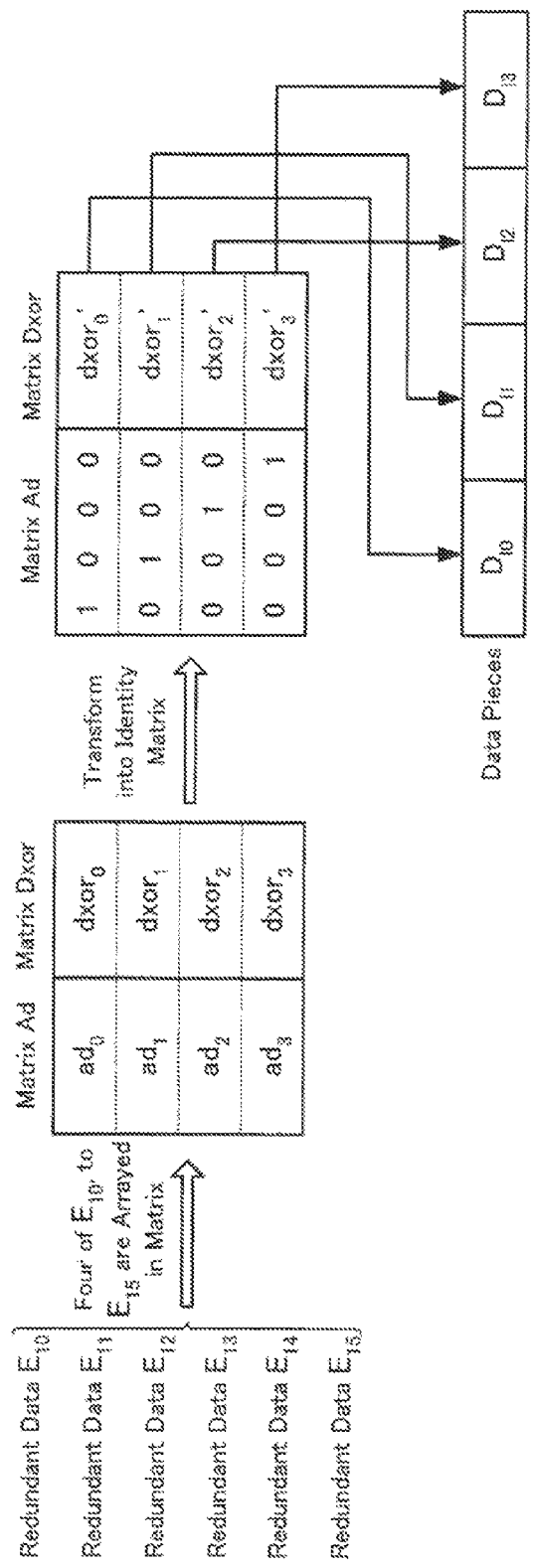
FIG. 11 illustrates operations for decoding according to the second embodiment.

Next, the processing for decoding is explained with reference to FIG. 11, which illustrates operations for decoding according to the second embodiment.

The decoder 240 selects and decodes, on a block-by-block basis, the sets of redundant data in the encoded data outputted from the expander 230. For example, in the processing for encoding illustrated in FIG. 5, for example, the sets $E_{10}$, $E_{11}$, $E_{12}$, $E_{13}$, $E_{14}$, and $E_{15}$ of redundant data are produced on the basis of the four data pieces $D_{10}$, $D_{11}$, $D_{12}$, and $D_{13}$ constituting the first block among the 0th to (h−1)-th blocks. On the other hand, before the four data pieces $D_{10}$, $D_{11}$, $D_{12}$, and $D_{13}$ are obtained by decoding, the sets $E_{10}$, $E_{11}$, $E_{12}$, $E_{13}$, $E_{14}$, and $E_{15}$ of redundant data are selected from the encoded data which is expanded, as illustrated in FIG. 11.

A basic procedure for obtaining data pieces in a block by decoding is explained below.

First, the decoder 240 selects m sets of redundant data from all the sets of redundant data corresponding to the block, where m is the number of columns in the encoding matrix A. Then, the decoder 240 reads out of the encoding matrix A the bit series used in the processing for encoding, on the basis of the row numbers contained in the selected sets of redundant data, and generates a matrix Ad in which the values of the bits in the bit series $ad_0$, $ad_1$, . . . , $ad_{m-1}$ are arrayed in a matrix arrangement. At this time, the decoder 240 also generates a matrix Dxor in which the values of the bits of the sets $dxor_0$, $dxor_1$, . . . , $dxor_{m-1}$ of exclusive OR data corresponding to the bit series are arrayed in a matrix arrangement. In the example of FIG. 11, m=4. Therefore, the matrix Ad is a 4×4 matrix in which the values of the bits in each of the bit series $ad_0$, $ad_1$, $ad_2$, and $ad_3$ are arrayed in a row, and the matrix Dxor is a 4×4 matrix in which the values of the bits in each of the sets $dxor_0$, $dxor_1$, $dxor_2$, and $dxor_3$ of exclusive OR data are arrayed in a row.

The decoder 240 transforms the matrix Ad into an identity matrix by performing exchange of rows, logical OR calculation of rows, and the like. For example, transformation into the identity matrix by transforming the matrix Ad into an upper triangle matrix and thereafter making all of one or more nondiagonal "1" elements ("1" bits) in the upper triangle matrix have the value "0". At this time, the operation which is performed on the matrix Ad for transforming the matrix Ad into the identity matrix is also performed on the matrix Dxor so as to transform the matrix Dxor. Thus, when the transformation of the matrix Ad into the identity matrix is achieved by the above operation, the bit series in the respective rows in the transformed matrix Dxor become the data pieces. In the example of FIG. 11, the bit series in the rows in the transformed matrix Dxor (when the transformation of the matrix Ad into the identity matrix is achieved) are respectively denoted by $dxor_0'$, $dxor_1'$, $dxor_2'$, and $dxor_3'$. That is, the bit series $dxor_0'$, $dxor_1'$, $dxor_2'$, and $dxor_3'$ respectively correspond to the data pieces $D_{10}$, $D_{11}$, $D_{12}$, and $D_{13}$.

In addition, when the matrix Ad produced on the basis of the m sets of redundant data which are initially selected cannot be transformed into an identity matrix, the decoder 240 restores a bit series on the basis of the next set of redundant data corresponding to the same block as the m sets of redundant data, adds the bit series based on the next set of redundant data to the matrix Ad, and transforms the bit-series-added matrix Ad into an identity matrix. At this time, the decoder 240 adds a set of exclusive OR data corresponding to the bit series based on the next set of redundant data to the matrix Dxor, and performs, on the data-added matrix Dxor, the same operation as the operation performed on the bit-series-added matrix Ad for transforming the bit-series-added matrix Ad into the identity matrix. When transformation of a submatrix corresponding to m rows among the m+1 rows of the bit-series-added matrix Ad into an identity matrix is achieved, the rows of the transformed, data-added matrix Dxor corresponding to the rows of the identity matrix transformed from the submatrix become the data pieces, respectively.

Sometimes, a portion of data can be lost by loss of a packet or the like before the encoded data is transmitted to the information processing apparatus 200 and expanded. Therefore, the encoded data obtained by expansion by the expander 230 does not necessarily contain all the sets of redundant data which are produced by encoding of a block. However, even in the case where one or more portions of the sets of redundant data corresponding to a block are lost, all the data pieces in the block can be restored as long as a matrix Ad produced on the basis of at least m sets of redundant data (among the plurality of sets of redundant data corresponding to the block) can be transformed into an identity matrix.

2.5.3 Sequence of Operations for Decoding

Figure 12:
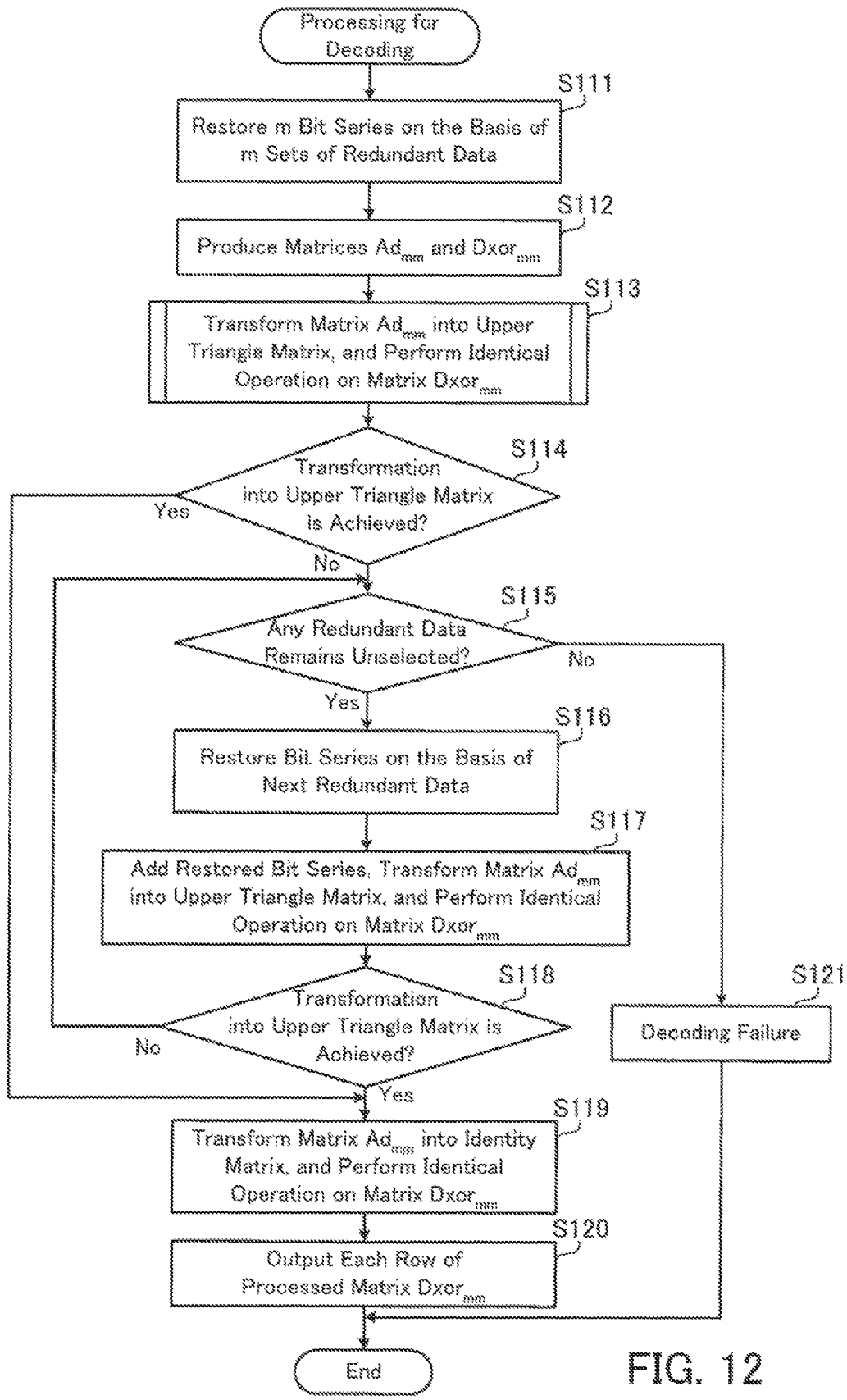
FIG. 12 indicates a flow of processing performed by a decoder according to the second embodiment.

FIG. 12 indicates a flow of processing for decoding performed by the decoder 240 according to the second embodiment. Specifically, in the processing of FIG. 12, the data pieces $D_{10}$, $D_{11}$, . . . , $D_{1(m-1)}$ contained in the l-th block of the data to be transmitted are restored by decoding the sets of redundant data. Therefore, the processing of FIG. 12 is repeated h times until the entire original data to be transmitted is restored, where h is the number of blocks of the data to be transmitted.

<Step S111> The decoder 240 selects m sets of redundant data from among all the sets of redundant data corresponding to the (l-th) block which are obtained by the processing for expansion. Then, the decoder 240 restores m bit series from the encoding matrix A on the basis of the row numbers contained in the m selected sets of redundant data.

<Step S112> The decoder 240 produces a matrix Ad (which is indicated as "$Ad_{mm}$," in FIG. 12) in which the values of the bits in the m bit series restored from the m sets of redundant data are arrayed in a matrix arrangement. In addition, the decoder 240 also produces a matrix Dxor (which is indicated as "$Dxor_{mm}$," in FIG. 12) in which the values of the bits in the m sets of exclusive OR data extracted from the corresponding sets of redundant data are arrayed in a matrix arrangement.

<Step S113> The decoder 240 performs an operation for transforming the matrix Ad into an upper triangle matrix. In addition, the decoder 240 performs the same operation as the operation for transforming the matrix Ad into the upper triangle matrix, on the matrix Dxor. Details of the operations in step S113 are explained later with reference to FIG. 13.

<Step S114> The decoder 240 determines whether or not the transformation of the matrix Ad into an upper triangle matrix is successfully achieved. When yes is determined in step S114, the operation goes to step S119. When no is determined in step S114, the operation goes to step S115.

<Step S115> The decoder 240 determines whether or not one or more of the sets of redundant data corresponding to the l-th block which are obtained by the processing for expansion remain unselected. When yes is determined in step S115, the operation goes to step S116. When no is determined in step S115, the operation goes to step S121.

<Step S116> The decoder 240 selects one of the one or more unselected sets of redundant data, and restores a bit series from the encoding matrix A on the basis of the row number contained in the selected set of redundant data.

<Step S117> The decoder 240 adds the bit series restored in step S116 to the matrix Ad of which the transformation into an upper triangle matrix is not yet achieved, so that the values of the bits in the bit series restored in step S116 are arranged an additional row in the bit-series-added matrix Ad. Then, the decoder 240 performs an operation for transforming the bit-series-added matrix Ad into an upper triangle matrix. At this time, the decoder 240 adds an exclusive OR data extracted from the set of redundant data selected in step S116, to the matrix Dxor on which the operation to be performed has not yet been completed, so that the values of the bits in the exclusive OR data extracted from the set of redundant data selected in step S116 are arranged an additional row in the data-added matrix Dxor. Then, the decoder 240 performs an operation identical to the operation performed on the matrix Ad, on the data-added matrix Dxor.

<Step S118> The decoder 240 determines whether or not transformation, into an upper triangle matrix, of a submatrix of the (bit-series-added) matrix Ad having m rows among the rows of the (bit-series-added) matrix Ad is achieved. When yes is determined in step S118, the operation goes to step S119. When no is determined in step S118, the operation goes to step S115.

<Step S119> The decoder 240 performs an operation for transforming the matrix Ad into an identity matrix, and performs an operation identical to the operation performed on the matrix Ad, on the matrix Dxor.

<Step S120> The decoder 240 outputs as data pieces bit series in m rows, corresponding to the identity matrix in the matrix Ad, of the matrix Dxor on which the operation in step S119 is performed.

<Step S121> In the case where the matrix Ad cannot be transformed into an upper triangle matrix, the matrix Ad cannot be transformed into an identity matrix. Therefore, the decoder 240 determines that the decoder 240 fails in decoding, and for example, makes the display device display the decoding failure.

In the case where the bit series per se, instead of the row number, is contained in the set of redundant data, the decoder 240 can directly extract the bit series from the set of redundant data without referring to the encoding matrix A in steps S111 and S116.

Figure 13:
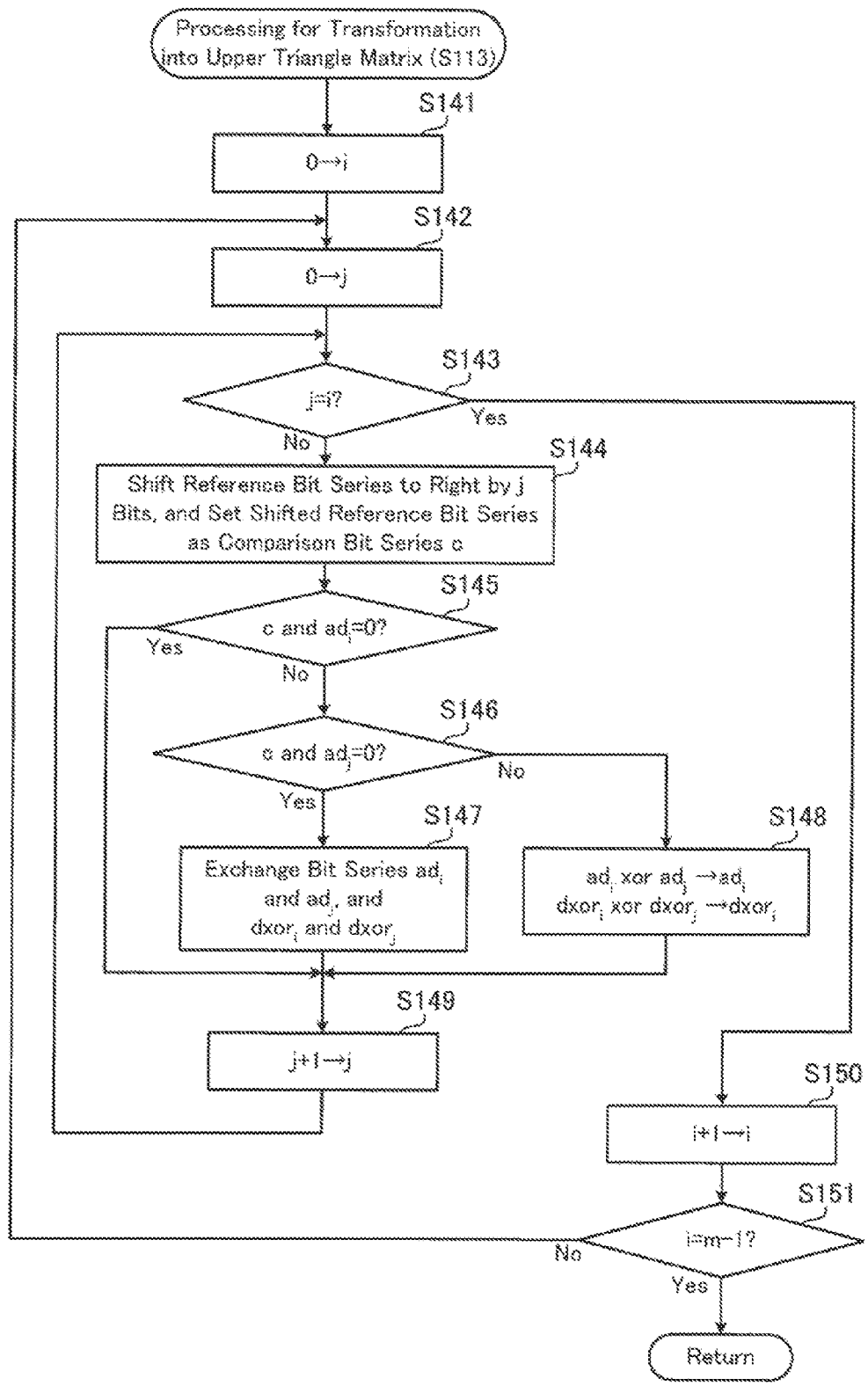
FIG. 13 indicates a sequence of operations performed in step S113 in FIG. 12.

FIG. 13 indicates an example of a sequence of operations performed in step S113 in FIG. 12.

<Step S141> The decoder 240 assigns "0" to the variable i, which indicates the row number of the row subject to processing in the matrix Ad.

<Step S142> The decoder 240 assigns "0" to the variable j, which indicates the row number of the row used for comparison in the matrix Ad.

<Step S143> The decoder 240 determines whether or not the values of the variables i and j are identical. When yes is determined in step S143, the operation goes to step S150. When no is determined in step S143, the operation goes to step S144.

<Step S144> The decoder 240 shifts a reference bit series to the right by j bits, and sets the shifted reference bit series as a comparison bit series c. The reference bit series is constituted by m bits, the value of only the most significant bit is "1", and the values of the other bits are "0".

<Step S145> The decoder 240 determines whether or not the logical product of the comparison bit series c and the bit series $ad_i$ in the i-th row of the matrix Ad is zero. When yes is determined in step S145, the operation goes to step S149. When no is determined in step S145, the operation goes to step S146.

<Step S146> The decoder 240 determines whether or not the logical product of the comparison bit series c and the bit series $ad_j$ in the j-th row of the matrix Ad is zero. When yes is determined in step S146, the operation goes to step S147. When no is determined in step S146, the operation goes to step S148.

<Step S147> The decoder 240 exchanges the bit series $ad_i$ in the i-th row and the bit series $ad_j$ in the j-th row in the matrix Ad, and exchanges the set $dxor_i$ of redundant data in the i-th row and the set $dxor_j$ of redundant data in the j-th row in the matrix Dxor.

<Step S148> The decoder 240 calculates the exclusive OR of the bit series $ad_i$ in the i-th row and the bit series $ad_j$ in the j-th row of the matrix Ad, and updates the bit series $ad_i$ in the i-th row with the calculated exclusive OR. In addition, the decoder 240 calculates the exclusive OR of the set $dxor_i$ of redundant data in the i-th row and the set $dxor_j$ of redundant data in the j-th row in the matrix Dxor, and updates the set $dxor_i$ of redundant data in the i-th row with the calculated exclusive OR.

<Step S149> The decoder 240 increments the variable j by one, and thereafter the operation goes to step S143.

<Step S150> The decoder 240 increments the variable i by one.

<Step S151> The decoder 240 determines whether or not the value of the variable i is m−1. When yes is determined in step S151, the operation goes to step S114 in FIG. 12. When no is determined in step S151, the operation goes to step S142.

The processing of FIG. 13 is assumed to be performed after the m×m matrix is produced on the basis of the m sets of redundant data. Alternatively, it is possible to produce the m×m matrix step by step by reading in the sets of redundant data one by one and determining the necessity of the exchange in step S147 and the exclusive OR calculation in step S148. In this case, for example, before the operation in step S142 is performed, the decoder 240 acquires a bit series $ad_i$ and a set of redundant data $dxor_i$ extracted from a set of redundant data which is newly read in, and performs the operations from step S143. In addition, immediately before the operation in step S150, the decoder 240 adds the bit series $ad_i$ and the set of redundant data $dxor_i$ to the bottom of the matrix Ad and the matrix Dxor, respectively, and updates the number of rows of each matrix.

Figure 14:
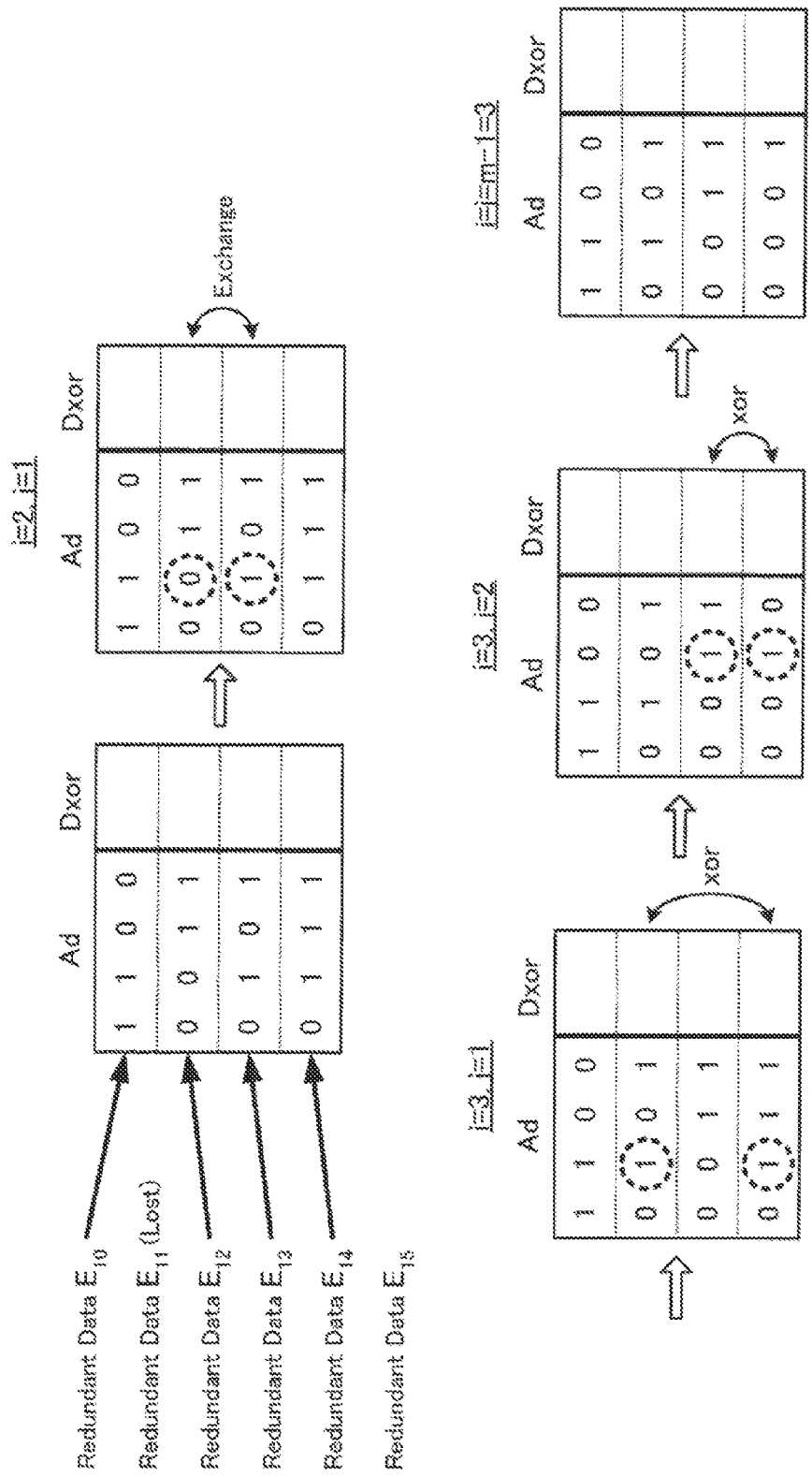
FIG. 14 indicates a concrete example of processing for transformation into an upper triangle matrix according to the second embodiment.

FIG. 14 indicates a concrete example of processing for transformation into an upper triangle matrix according to the second embodiment. In the following explanations with reference to FIG. 14, the number m of columns in the encoding matrix A is assumed to be four as in the example of FIG. 5. In addition, it is assumed that the decoder 240 can normally acquire the sets $E_{10}$, $E_{12}$, $E_{13}$, $E_{14}$, and $E_{15}$ from among $E_{10}$, $E_{11}$, $E_{12}$, $E_{13}$, $E_{14}$, and $E_{15}$ of redundant data illustrated in FIG. 5, and cannot normally acquire the set E11 of redundant data.

First, in step S111 in FIG. 12, the decoder 240 restores m bit series on the basis of m sets $E_{10}$, $E_{11}$, $E_{12}$, and $E_{13}$ of redundant data, respectively. Then, in step S112, the decoder 240 produces the matrix Ad and the matrix Dxor. In the example of the matrix Ad illustrated in FIG. 14, the bit series $ad_0$ in the 0th row is "1100", the bit series $ad_1$ in the 1st row is "0011", the bit series $ad_2$ in the 2nd row is "0101", and the bit series $ad_3$ in the 3rd row is "0111".

In the case where the above matrix Ad is used in the processing of FIG. 13, the operations are as follows.

When i=0, it is determined, in step S143, that j=i, so that the operation goes to step S150, and the matrix Ad is not changed. Next, when i=1 and j=0, the logical product calculated in step S145 is zero, so that the matrix Ad is not changed.

When i=2 and j=0, the logical product calculated in step S145 is zero, so that the matrix Ad is not changed. When i=2 and j=1, the logical product of the comparison bit series c ("0100") and the bit series $ad_2$ ("0101") is not zero, so that the operation goes to step S146. Then, in step S146, the logical product of the comparison bit series c ("0100") and the bit series $ad_1$ ("0011") is zero, so that the operation goes to step S147, in which the 1st row and the 2nd row of the matrix Ad are exchanged. That is, the matrix Ad is updated. At this time, the 1st row and the 2nd row of the matrix Dxor are also exchanged. That is, the matrix Dxor is also updated.

When i=3 and j=0, the logical product calculated in step S145 is zero, so that the matrix Ad is not changed. When i=3 and j=1, the logical product of the comparison bit series c ("0100") and the bit series $ad_3$ ("0111") is not zero, so that the operation goes to step S146. Then, in step S146, the logical product of the comparison bit series c ("0100") and the bit series $ad_1$ ("0101") is not zero, so that the operation goes to step S148. In step S148, the exclusive OR of the bit series $ad_1$ ("0101") in the 1st row and the bit series $ad_3$ ("0111") in the 3rd row is calculated, and the bit series $ad_3$ is updated with the calculation result "0010". That is, in step S148, the 1st bit (when the most significant bit is defined to be the 0th bit) of the bit series $ad_3$ ("0111") in the 3rd row, which unnecessarily has the value "1", is converted into the "0" bit. At this time, similarly to the matrix Ad, the exclusive OR of the 1st row and the 3rd row of the matrix Dxor is calculated, and the 3rd row of the matrix Dxor is updated with the calculation result.

When i=3 and j=2, the logical product of the comparison bit series c ("0010") and the bit series $ad_3$ ("0010") is not zero, so that the operation goes to step S146. Then, in step S146, the logical product of the comparison bit series c ("0010") and the bit series $ad_2$ ("0011") is not zero, so that the operation goes to step S148. In step S148, the exclusive OR of the bit series $ad_2$ ("0011") in the 2nd row and the bit series $ad_3$ ("0111") in the 3rd row is calculated, and the bit series $ad_3$ is updated with the calculation result "0001". At this time, similarly to the matrix Ad, the exclusive OR of the 2nd row and the 3rd row of the matrix Dxor is calculated, and the 3rd row of the matrix Dxor is updated with the calculation result.

After the processing of FIG. 13, in step S114 in FIG. 12, it is determined whether or not the values of all of the 0th bit in the 1st row, the 0th and 1st bits in the 2nd row, and the 0th, 1st, and 2nd bits in the 3rd row in the matrix Ad are zero. In the example of FIG. 14, the values of all of the above bits are zero. Therefore, the matrix Ad is transformed into an upper triangle matrix.

In the example of FIG. 14, the matrix Ad produced on the basis of the m sets $E_{10}$, $E_{12}$, $E_{13}$, and $E_{14}$ of redundant data which are first selected can be transformed into the upper triangle matrix. However, in the case where the matrix Ad produced on the basis of m selected sets of redundant data cannot be transformed into the upper triangle matrix, the operation goes to step S116 in FIG. 12, a bit series and a set of exclusive OR data obtained on the basis of the next set of redundant data are added to the matrix Ad and the matrix Dxor, respectively. In step S117 in FIG. 12, the operations in step S142 to S150 in FIG. 13 are performed, where the bit series $ad_i$ is the bit series obtained on the basis of the newly selected set of redundant data. Then, in step S118 in FIG. 12, it is determined whether or not the submatrix corresponding to the 0th to (m−1)-th rows of the matrix Ad is an upper triangle matrix.

Figure 15:
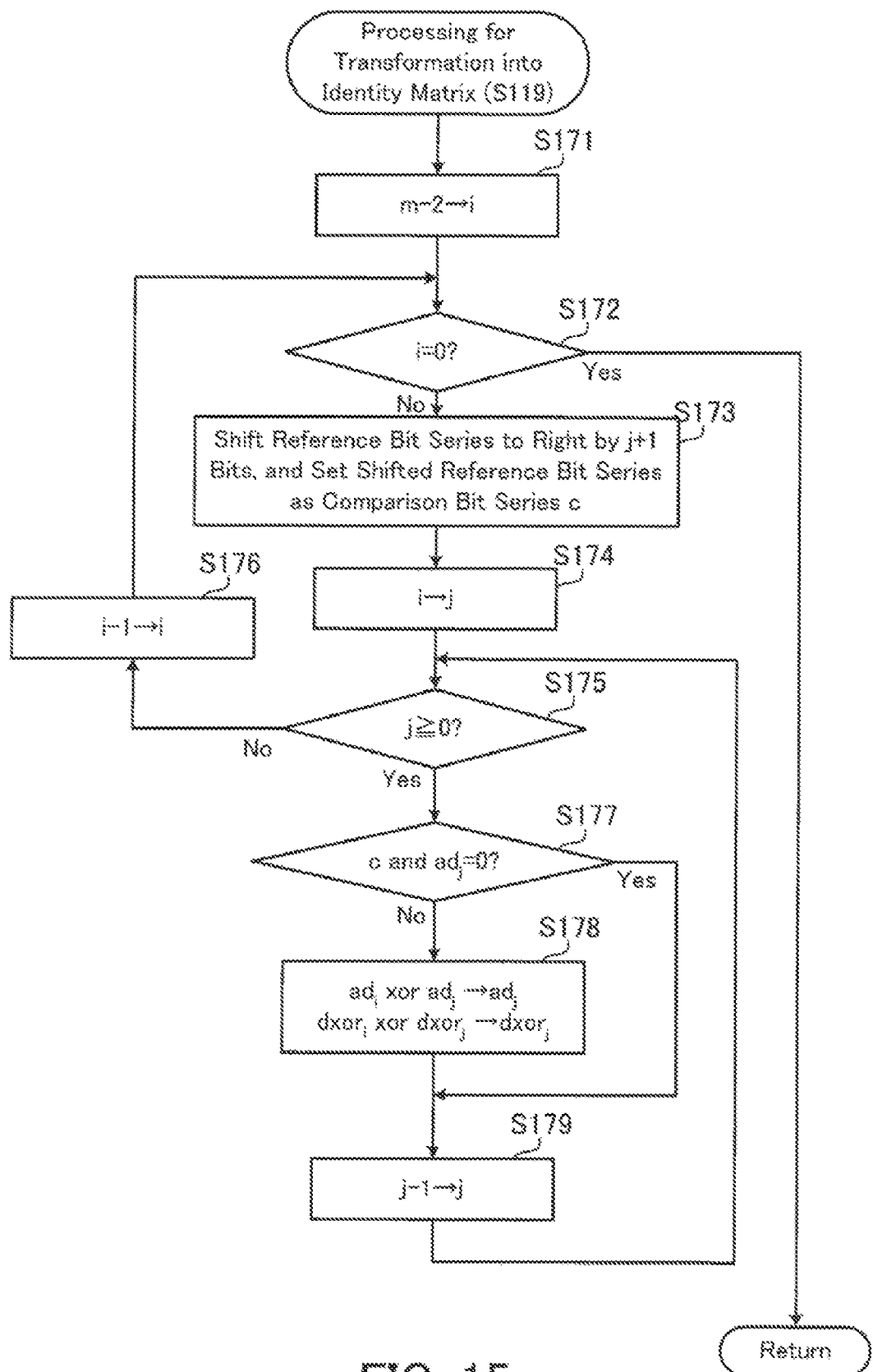
FIG. 15 indicates a sequence of operations performed in step S119 in FIG. 12.

FIG. 15 indicates a sequence of operations performed in step S119 in FIG. 12.

<Step S171> The decoder 240 assigns m−2 to the variable i. That is, the second row from the bottom in the upper triangle matrix is set as a row used in comparison.

<Step S172> The decoder 240 determines whether or not the variable i is zero. When the variable i is equal to or greater than one, the operation goes to step S173. When the variable i is zero, the processing for transforming the upper triangle matrix into an identity matrix is completed.

<Step S173> The decoder 240 shifts the aforementioned reference bit series to the right by i+1 bits, and sets the bit-shifted reference bit series as a comparison bit series c.

<Step S174> The decoder 240 assigns the value of the variable i to a variable j which indicates the row number of the row subject to processing.

<Step S175> The decoder 240 determines whether or not the variable j is zero or greater. When the variable j is zero or greater, the operation goes to step S177. When the variable j is smaller than zero, the operation goes to step S176.

<Step S176> The decoder 240 decrements the variable i by one, so as to move upward the row used in comparison. Thereafter, the operation goes to step S172.

<Step S177> The decoder 240 determines whether or not the logical product of the comparison bit series c and the bit series $ad_j$ in the j-th row in the matrix Ad is zero. When yes is determined in step S177, the operation goes to step S179. When no is determined in step S177, the operation goes to step S178.

<Step S178> The decoder 240 calculates the exclusive OR of the bit series $ad_i$ in the i-th row and the bit series $ad_j$ in the j-th row in the matrix Ad, and updates the bit series $ad_d$ in the j-th row with the calculation result, so that the value "1" of the i-th bit in the j-th row in the matrix Ad is converted into "0". In addition, the decoder 240 calculates the exclusive OR of the set $dxor_i$ of exclusive OR data in the i-th row and the set dxor$_j$ of exclusive OR data in the j-th row in the matrix Dxor, and updates the set dxor$_j$ of exclusive OR data in the j-th row with the calculation result.

<Step S179> The decoder 240 decrements the variable j by one, so as to move upward the row subject to processing. Thereafter, the operation goes to step S175.

According to the processing of FIG. 15, the values of all the nondiagonal bits located on the right side of the m diagonal bits of the upper triangle matrix transformed from the matrix Ad are converted into "0", i.e., the upper triangle matrix is transformed into an identity matrix.

2.6 Production of Encoding Matrix

Figure 16:
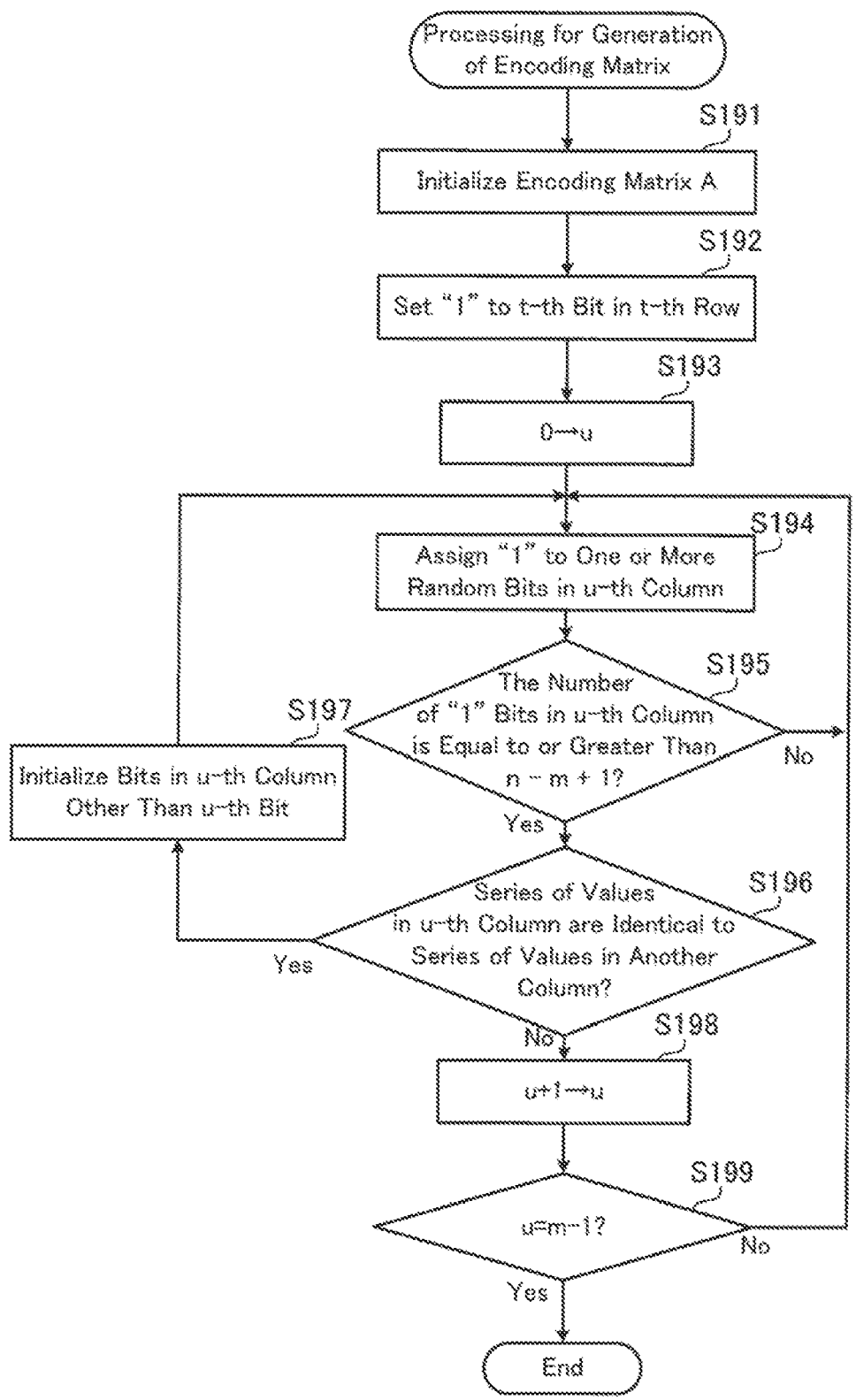
FIG. 16 indicates a flow of processing for generating an encoding matrix according to the second embodiment.

The encoding matrix A can be produced, for example, by the following processing. FIG. 16 indicates a flow of processing for generating an encoding matrix according to the second embodiment. The processing of FIG. 16 may be performed, for example, by the information processing apparatus 100. In this case, the produced encoding matrix A is passed to the information processing apparatus 200 before data are actually transmitted between the information processing apparatuses 100 and 200.

<Step S191> The information processing apparatus 100 initializes the encoding matrix A having n rows and m columns.

<Step S192> The information processing apparatus 100 sets the value "1" to the t-th bit in the t-th row in the encoding matrix A, where t is an integer satisfying $0 \leq t \leq m-1$.

<Step S193> The information processing apparatus 100 assigns the value "0" to the variable u.

<Step S194> The information processing apparatus 100 assigns the value "1" to one or more random bits in the u-th column.

<Step S195> The information processing apparatus 100 determines whether or not the number of "1" bits in the u-th column is equal to or greater than n−m+1. When the number of "1" bits in the u-th column is equal to or greater than n−m+1, the operation goes to step S196. When the number of "1" bits in the u-th column is smaller than n−m+1, the operation goes to step S194.

<Step S196> The information processing apparatus 100 determines whether or not the bits arrayed in any column other than the u-th column have the same series of values as the bits arrayed in the u-th column. When yes is determined in step S196, the operation goes to step S197. When no is determined in step S196, the operation goes to step S198.

<Step S197> The information processing apparatus 100 initializes the u-th column in the encoding matrix A by setting the value "0" to each of the bits in the u-th column other than the u-th bit, and thereafter the operation goes to step S194.

<Step S198> The decoder 240 increments the variable u by one.

<Step S199> The information processing apparatus 100 determines whether or not the value of the variable u is m−1. When yes is determined in step S199, the processing of FIG. 16 is completed. When no is determined in step S199, the operation goes to step S194.

In the encoding matrix A produced by the processing of FIG. 16, all the diagonal elements have the value "1", the bits arrayed in each column have a different series of values, and every column has n−m+1 or more "1" bits. In addition, the reliability of transmission of encoded data increases with the number n of rows of the encoding matrix A. In order to further increase the reliability, it is desirable that the encoding matrix A can be easily transformed into an identity matrix. However, the encoding matrix A produced by the processing of FIG. 16 does not necessarily satisfy the condition that the encoding matrix A can be easily transformed into an identity matrix. Further, the increase in the values of n and m makes the production of an encoding matrix A satisfying the above condition more difficult. Therefore, for example, it is possible to produce a plurality of candidates for the encoding matrix A by the processing of FIG. 16, perform, an appropriate number of times, operations of randomly thinning out the rows in each candidate and transforming the candidate toward an identity matrix, and adopt one of the candidates which is transformed into an identity matrix with the highest probability.

2.7 Advantages of Second Embodiment

When data to be transmitted is encoded by the information processing apparatus 100 according to the second embodiment explained above, the information processing apparatus 200 according to the second embodiment explained above can restore the data to be transmitted, in many cases where a portion of data is lost, e.g., loss of a packet occurs on a transmission line. Therefore, even in the case where data to be transmitted is transmitted by use of a non-procedure communication protocol such as UDP, the reliability of the data transmission can be increased.

In addition, since the data to be transmitted is compressed, after the encoding, by use of the bit series used in the encoding, the volume of transmitted data can be reduced. Thus, the use of the non-procedure communication protocol and the reduction in the volume of transmitted data increase the effective transmission rate. That is, the present embodiment is advantageous in improvement in the transmission rate and reliability.

Further, since the bit series used in encoding and decoding of data in common are also used in compression and expansion of the data, it is unnecessary to store special data in advance for compression on the transmitter side and expansion on the receiver side, and transmit the special data in advance between the transmitter side and the receiver side for the compression and expansion. Therefore, it is possible to improve the processing efficiency, and save the memory capacity on both of the transmitter side and the receiver side.

3. Third Embodiment

Hereinbelow, the third embodiment, which is different from the second embodiment in the processing for encoding and decoding, is explained.

3.1 Functions of Image Processing Apparatuses

Figure 17:
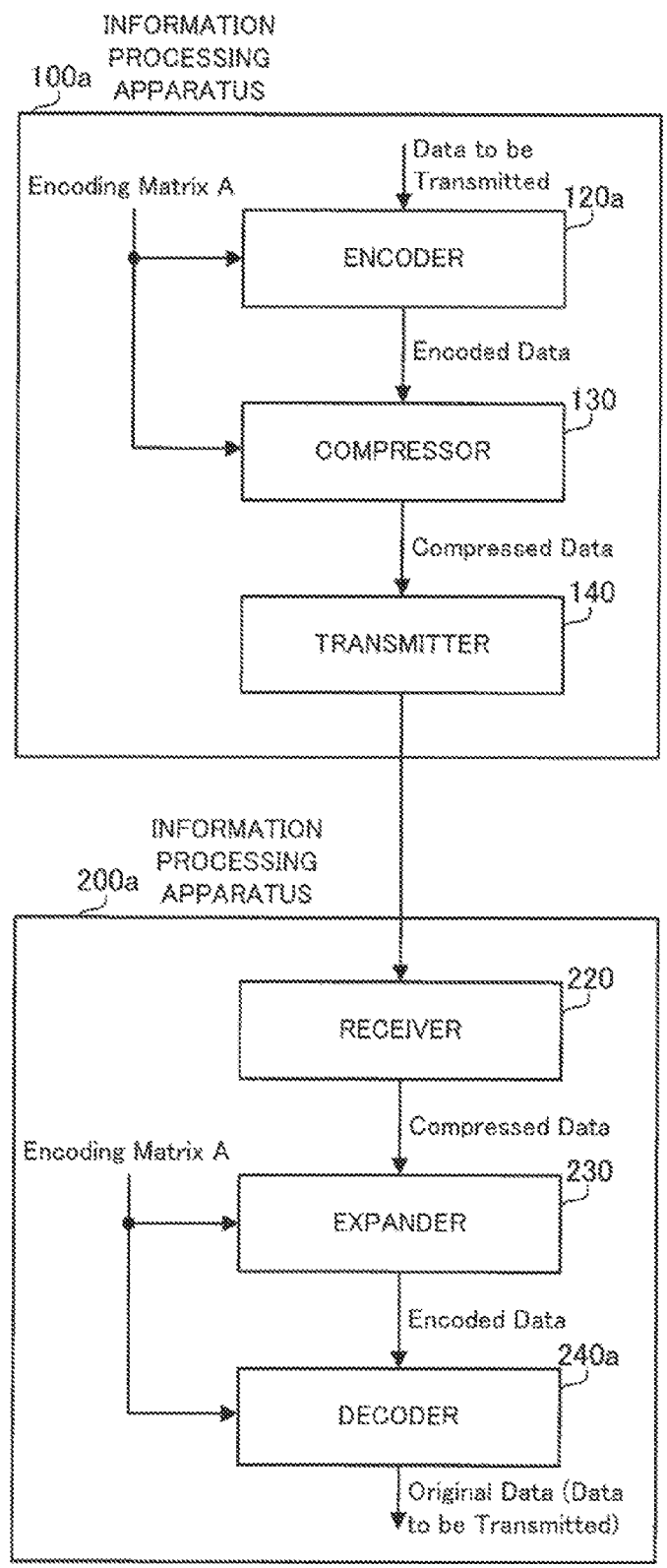
FIG. 17 illustrates functions of information processing apparatuses according to a third embodiment, which are respectively arranged on a transmitter side and a receiver side.

FIG. 17 illustrates the functions of information processing apparatuses according to the third embodiment, which are respectively arranged on a transmitter side and a receiver side. In FIG. 17, the information processing apparatuses 100*a* and 200*a* according to the third embodiment respectively correspond to the information processing apparatuses 100 and 200 according to the second embodiment. That is, data are transmitted from the information processing apparatus 100*a* to the information processing apparatus 200*a*. Each of the information processing apparatuses 100*a* and 200*a* has a hardware construction, for example, as illustrated in FIG. 3, and the information processing apparatuses 100*a* and 200*a* are connected through a network, for example, as illustrated in FIG. 1.

The information processing apparatus 100*a* comprises an encoder 120*a*, a compressor 130, and a transmitter 140. The compressor 130 and the transmitter 140 in the information processing apparatus 100a according to the third embodiment perform the same operations as the compressor 130 and the transmitter 140 in the information processing apparatus 100 according to the second embodiment, respectively. However, since the encoded data outputted from the encoder 120a according to the third embodiment has a structure different from the encoded data outputted from the encoder 120 according to the second embodiment, the contents of the sets of redundant data handled by the compressor 130 and the transmitter 140 in the information processing apparatus 100a according to the third embodiment are different from the contents of the sets of redundant data handled by the compressor 130 and the transmitter 140 in the information processing apparatus 100 according to the second embodiment.

The encoder 120a encodes data to be transmitted, so as to enable data restoration on the receiver side even in the case where a portion of transmitted data is lost on the network, as in the second embodiment. In addition, the third embodiment is identical to the second embodiment in that the encoding bit series (bit series for encoding) are used by both of encoding performed on the transmitter side and the decoding performed on the receiver side in common. However, the procedure performed for encoding by the encoder 120a according to the third embodiment is different from the procedure performed for encoding by the encoder 120 according to the second embodiment.

The encoder 120a performs processing for encoding in units of data pieces of the data to be transmitted, where the data pieces are produced by dividing the data to be transmitted, and each of the data pieces has m bits, and m is an integer equal to or greater than one. On the other hand, the number of bits of the encoding bit series is m×n, where n is an integer equal to or greater than m. The encoder 120a divides the encoding bit series into n unit bit series each of which is constituted by m bits, and selects the n unit bit series.

The encoder 120a substitutes the data pieces and the unit bit series into a set of simultaneous Boolean equations, and obtains a solution of the set of simultaneous Boolean equations. Then, the encoder 120a produces encoded data by combining the obtained solution and information indicating the positions, in the encoding bit series, of the unit bit series used in solving the set of simultaneous Boolean equations, and outputs the encoded data.

In the present embodiment, the encoding bit series is prepared in the form of an encoding matrix A having n rows and m columns. The information indicating the positions of the unit bit series may be the row number in the encoding matrix A. The values of m and n in the third embodiment are not necessarily identical to the values of m and n in the second embodiment.

The information processing apparatus 200a on the receiver side comprises a receiver 220, an expander 230, and a decoder 240a. The receiver 220 and the expander 230 in the information processing apparatus 200a according to the third embodiment perform the same operations as the receiver 220 and the expander 230 in the information processing apparatus 200 according to the second embodiment, respectively. However, since the encoded data outputted from the encoder 120a according to the third embodiment has a structure different from the encoded data outputted from the encoder 120 according to the second embodiment, the contents of the sets of redundant data handled by the receiver 220 and the expander 230 in the information processing apparatus 200a according to the third embodiment are different from the contents of the sets of redundant data handled by the receiver 220 and the expander 230 in the information processing apparatus 200 according to the second embodiment.

The decoder 240a decodes encoded data, which are obtained by expansion performed by the expander 230. Specifically, the decoder 240a restores unit bit series from the encoding bit series (in the form of the encoding matrix A according to the third embodiment) on the basis of the position information extracted from the encoded data, and restores the data to be transmitted, by substituting the restored unit bit series and the corresponding solution into the set of simultaneous Boolean equations.

3.2 Example of Encoding

Figure 18:
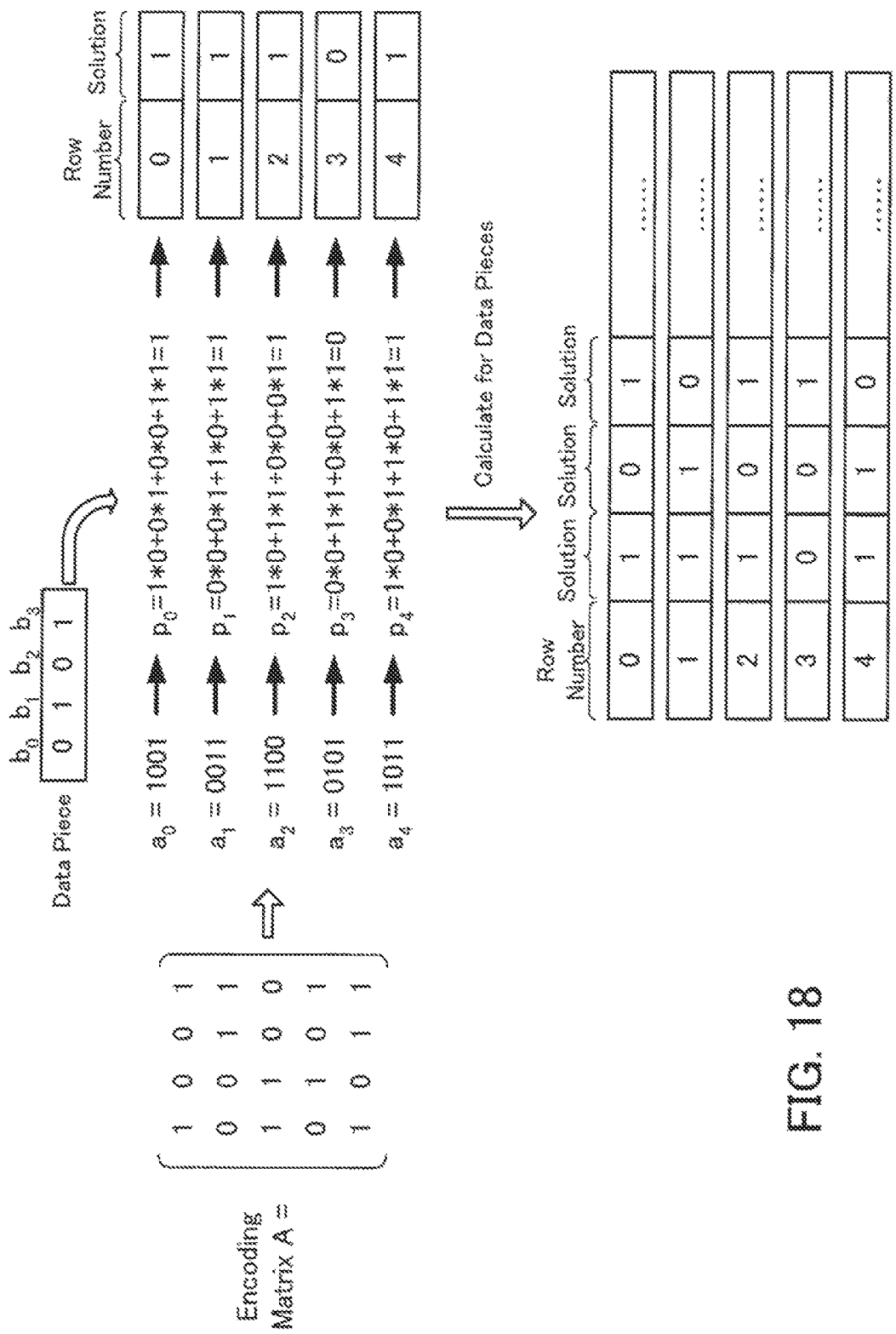
FIG. 18 illustrates operations for encoding according to the third embodiment.

FIG. 18 illustrates operations for encoding according to the third embodiment. In the following explanations, the bits of a data piece are denoted by $b_0, b_1, \ldots, b_{m-1}$, and the encoding bit series is provided in the form of the encoding matrix A having five rows and four columns (i.e., n=5 and m=4). The bits constituting the bit series $a_i$ in the i-th row in the encoding matrix A are denoted by $a_{i0}, a_{i1}, \ldots, a_{i(m-1)}$, where i is an integer equal to or greater than zero.

In the information processing apparatus 100a on the transmitter side, the encoder 120a obtains a solution $p_i$ of a set of simultaneous Boolean equations (1) by using the above data piece and each bit series $a_i$ in the i-th row in the encoding matrix A, where i=0, 1, . . . , 4. That is, the solutions $p_0, p_1, \ldots, p_{n-1}$ are obtained in correspondence with the bit series $a_0, a_1, \ldots, a_{n-1}$, respectively.

$$b_0 a_{i0} + b_1 a_{i1} + b_2 a_{i2} + \ldots + b_{m-1} a_{i(m-1)} = p_i (0 \leq i \leq m-1) \quad (1)$$

In each of the simultaneous Boolean equations (1), the sum of the logical products of the bits $b_0, b_1, \ldots b_{m-1}$ of the data piece and the respectively corresponding bits of each bit series $a_i$ of the bit series $a_0, a_1, \ldots, a_{n-1}$ is calculated as each solution $p_i$, where $p_i$ is "1" when the corresponding sum of the logical products is an odd number, and "0" when the corresponding sum of the logical products is an even number. The encoder 120a includes, in encoded data, the sets of the solutions $p_0, p_1, \ldots, p_{n-1}$ and the row numbers of the bit series $a_0, a_1, \ldots, a_{n-1}$ which are used in the calculation of the solutions $p_0, p_1, \ldots, p_{n-1}$, respectively. In the example of FIG. 18, the solutions $p_0, p_1, p_2, p_3$, and $p_4$ of the set of simultaneous Boolean equations (1) are calculated as 1, 1, 1, 0, and 1 in correspondence with the five unit bit series in the five rows in the encoding matrix A, respectively. The encoder 120a includes, in encoded data, the solutions $p_0, p_1, p_2, p_3$, and $p_4$ and the row numbers of the corresponding rows. The above processing is performed for each data piece, so that solutions respectively corresponding to the data pieces are obtained and included in the encoded data. Specifically, in the sequence of operations indicated in FIG. 20, a set of solutions calculated on the basis of a single bit series and a predetermined number of data pieces and the row number of the single bit series in the encoding matrix A is outputted as a set of redundant data.

3.3 Example of Decoding

Figure 19:
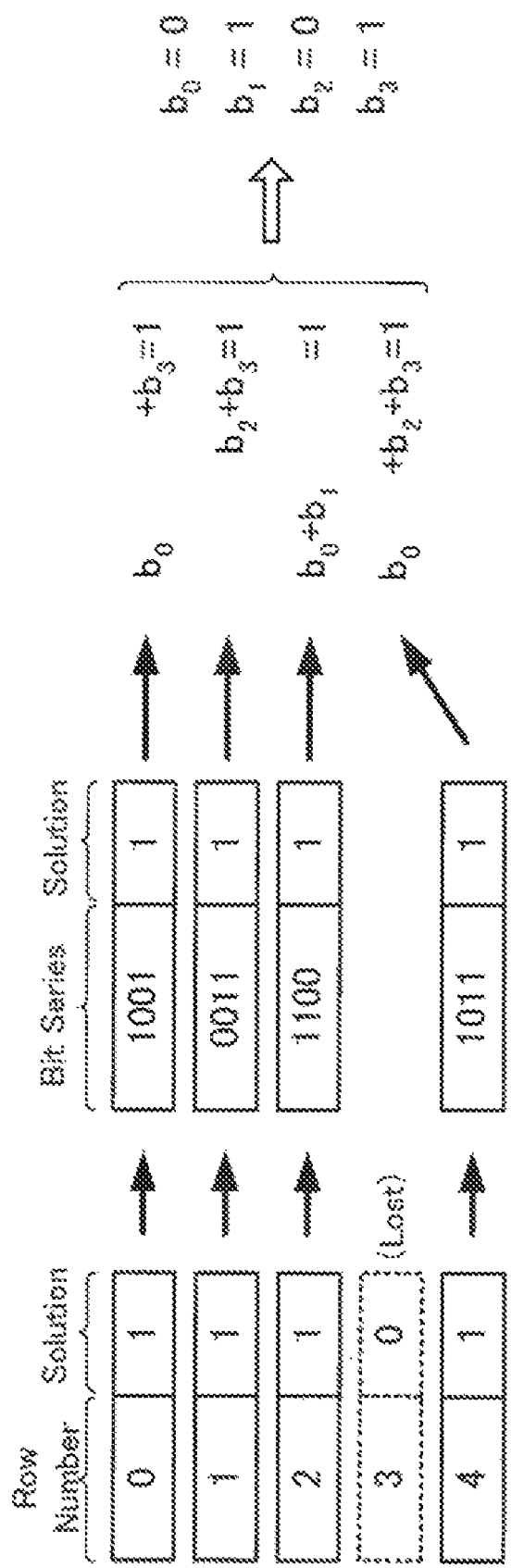
FIG. 19 illustrates operations for decoding according to the third embodiment.

FIG. 19 illustrates operations for decoding according to the third embodiment. In the information processing apparatus 200a on the receiver side, the decoder 240a extracts the row numbers from the encoded data (which is obtained by expansion), and restores the bit series $a_0, a_1, \ldots, a_{n-1}$ from the encoding matrix A on the basis of the row numbers. In addition, the decoder 240a obtains solutions based on a single data piece and the bit series $a_0, a_1, \ldots, a_{n-1}$ by successively selecting the bit series $a_0, a_1, \ldots, a_{n-1}$. Then, the decoder 240a substitutes the obtained solutions and the bit series $a_0, a_1, \ldots, a_{n-1}$ into the set of simultaneous Boolean equations (1), in which only the data bits corresponding to the "1" bits in the bit series $a_0, a_1, \ldots, a_{n-1}$ are effective, and the data bits corresponding to the "0" bits in the bit series $a_0, a_1, \ldots a_{n-1}$ are removed. The decoder 240a restores the data piece constituted by m bits, by solving the set of simultaneous Boolean equations (1) into which the above substitution is performed.

In the example of FIG. 19, it is assumed that the decoder 240a can acquire from the expanded data the row numbers "0", "1", "2", and "4" and the solutions corresponding to the row numbers "0", "1", "2", and "4", and cannot acquire the row number "3" and the solution corresponding to the row number "3", for example, due to loss of a packet. In this case, the bit series "1001", "1011", "1100", and "0101" are restored from the acquired row numbers, and the restored bit series and the corresponding solutions are substituted into the set of simultaneous Boolean equations (1). Then, the values of the bits $b_0$, $b_1$, $b_2$, and $b_3$ are respectively obtained as and "0", "1", "0", and "1" by solving the set of simultaneous Boolean equations (1). As in the above example, in many cases where a portion of the expanded data is lost, the data pieces can be restored as long as solutions corresponding to at least m bit series are acquired from the remaining portions of the expanded data.

The calculation of the set of simultaneous Boolean equations by the encoder 120a is equivalent to calculation of the logical products of the bits $b_0, b_1, \ldots, b_{m-1}$ of the data piece and the respectively corresponding bits of each of the bit series $a_0, a_1, \ldots, a_{n-1}$ and the counting of the number of "1" bits in the calculated logical products (i.e., checking of parity bits). Alternatively, the processing for solving the set of simultaneous Boolean equations can be efficiently executed by the decoder 240a using exclusive OR calculations which are similar to the exclusive OR calculations performed in the second embodiment. Hereinbelow, a processing sequence for encoding in the above equivalent manner and a processing sequence for decoding in the above alternative manner are explained with reference to flow diagrams, respectively.

3.4 Sequence of Operations for Encoding

Figure 20:
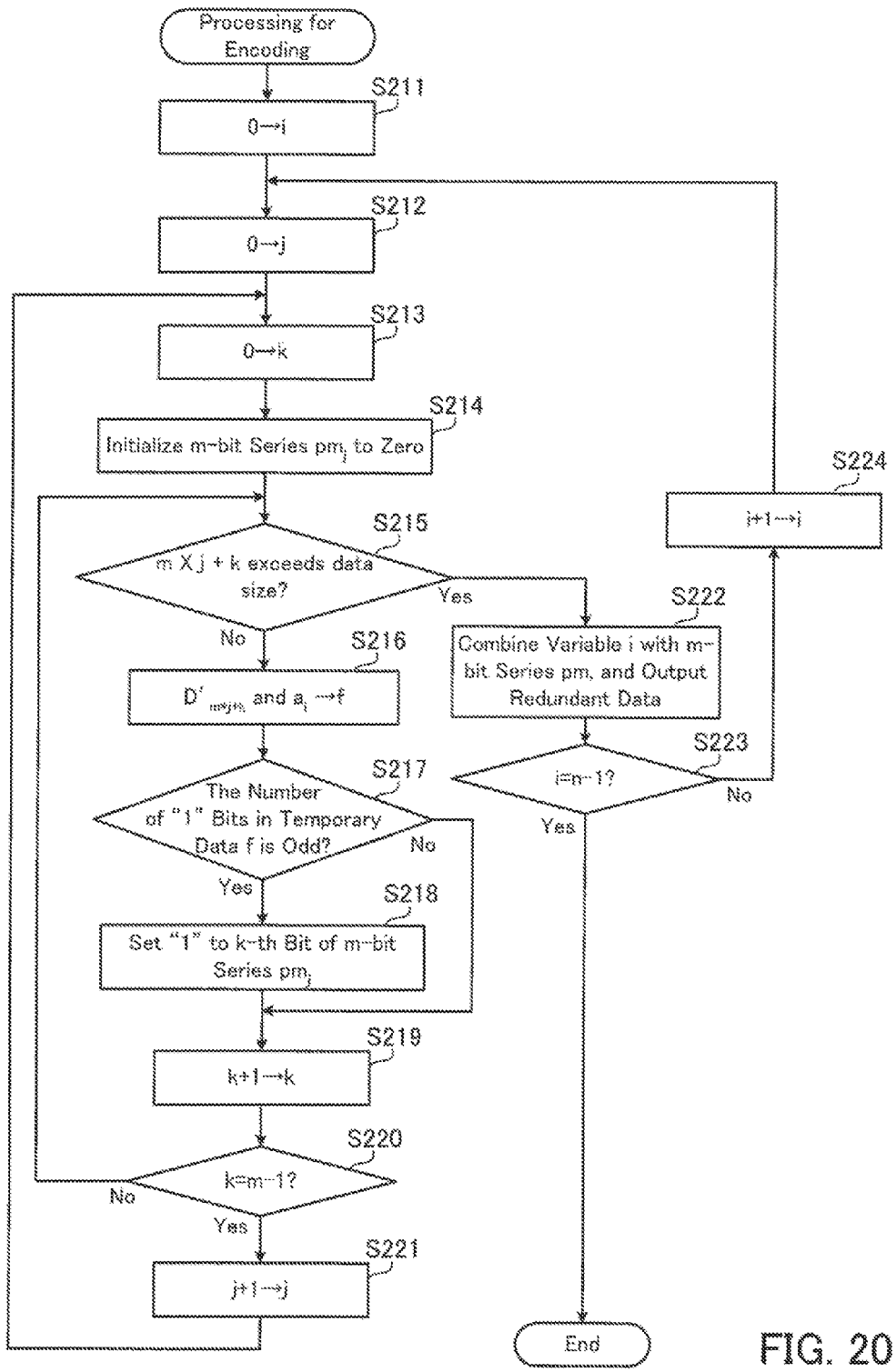
FIG. 20 indicates a flow of processing performed by an encoder according to the third embodiment.

FIG. 20 indicates a flow of processing performed for encoding according to the third embodiment.

<Step S211> The encoder 120a assigns "0" to the variable i.

<Step S212> The encoder 120a assigns "0" to the variable j.

<Step S213> The encoder 120a assigns "0" to the variable k.

<Step S214> The encoder 120a initializes the value of each bit of the m-bit series $pm_j$ corresponding to m solution bits to zero. The m-bit series $pm_j$ correspond to m solutions corresponding to one $a_i$ of the bit series $a_0, a_1, \ldots, a_{n-1}$ and being obtained on the basis of m blocks of data to be transmitted.

<Step S215> The encoder 120a determines whether or not the value of m×j+k exceeds the size (the number of bits) of the data to be transmitted. When yes is determined in step S215, it is determined that the processing of FIG. 20 is already performed on the entire data to be transmitted, and the operation goes to step S221. When no is determined in step S215, the operation goes to step S216.

<Step S216> The encoder 120a assigns the logical product of the (m×j+k)-th data piece $D'_{m*j+k}$ and the i-th bit series $a_i$ to temporary data f.

<Step S217> The encoder 120a counts the number of "1" bits in the temporary data f. When the number of "1" bits in the temporary data f is odd, the operation goes to step S218.

When the number of "1" bits in the temporary data f is even, the operation goes to step S219.

<Step S218> The encoder 120a sets "1" to the k-th bit of the m-bit series $pm_j$.

<Step S219> The encoder 120a increments the variable k by one.

<Step S220> The encoder 120a determines whether or not the variable k is equal to m−1. When the variable k is smaller than m−1, the operation goes to step S215. In this case, when the operation goes through step S215 to step S216, the bit series $a_i$ is compared with the next data piece. Thus, in the looped sequence of operations in steps S215 to S220, the bit series $a_i$ is compared with the m data pieces obtained on the basis of m blocks of data to be transmitted, and the values calculated on the basis of the data pieces are set in the corresponding bits of the m-bit series $pm_j$. When the variable k reaches m−1, the operation goes to step S221.

<Step S221> The encoder 120a increments the variable j by one, and the operation goes to step S213. Then, a new m-bit series $pm_j$ is generated on the basis of the subsequent m data pieces by the operations in steps S213 to S220.

<Step S222> At this time, the operations of comparing one $a_i$ of the bit series $a_0, a_1, \ldots, a_{n-1}$ and all the data pieces $D'_0, D'_1, D'_2, \ldots$ are completed. The encoder 120a produces a set of redundant data by combining the value of the variable i (which indicates the row number of the bit series $a_i$ in the encoding matrix A) and each of the m-bit series $pm_0, pm_1, \ldots pm_{j-1}$, and outputs the produced set of redundant data. That is, according to the third embodiment, each set of redundant data contains the row number (indicated by a value of the variable i) and solutions obtained on the basis of m data pieces (i.e., an m-bit series). Alternatively, as in the second embodiment, each set of redundant data may contain the bit series per se, instead of the row number.

<Step S223> The encoder 120a determines whether or not the variable i is equal to n−1. When the variable i is smaller than n−1, the operation goes to step S224. When the variable i is equal to n−1, the processing of FIG. 20 is already performed for all the bit series $a_0, a_1, \ldots, a_{n-1}$, and the processing of FIG. 20 is completed.

<Step S224> The encoder 120a increments the variable i by one, and the operation goes to step S212, so that solutions corresponding to the next bit series are calculated by the operations in steps S212 to S222.

The sets of redundant data which are obtained by the above processing of FIG. 20 are successively supplied to the compressor 130, and the processing for compression of FIG. 8 is performed on the sets of redundant data. Then, the compressed data outputted from the compressor 130 is packetized by the transmitter 140 in such a manner that each packet contains a set of redundant data. Thereafter, in the information processing apparatus 200a, the receiver 220 extracts the set of redundant data from each packet, and the expander 230 expands the set of redundant data, and supplies the expanded data to the decoder 240a.

Alternatively, in step S222, the encoder 120a may output as the redundant data the m-bit series $pm_0, pm_1, \ldots, pm_{j-1}$ corresponding to all the data pieces after output of a value of the variable i (which indicates the row number of the bit series $a_i$ in the encoding matrix A). In this case, each m-bit series (indicating m solutions) is contained in a set of redundant data, and the processing for compression is performed in units of m-bit series. On the other hand, the value of the variable i is not subject to the compression. Therefore, after the processing for compression, for example, a packet containing the value of the variable i and packets each of which contains a compressed set of redundant data corresponding to an m-bit series are separately generated.

3.5 Sequence of Operations for Decoding

Figure 21:
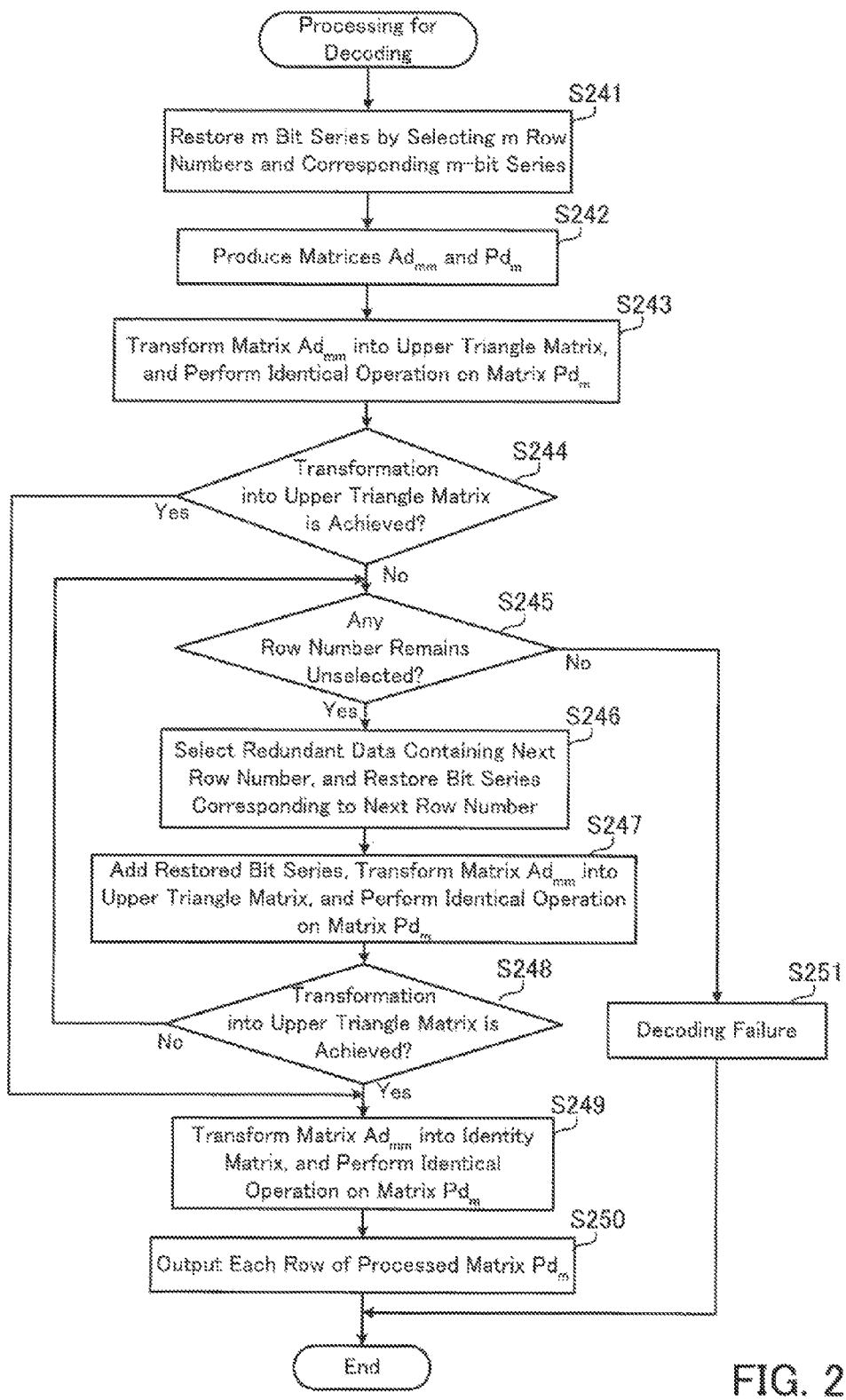
FIG. 21 indicates a flow of processing performed by a decoder according to the third embodiment.

FIG. 21 indicates a flow of processing performed for decoding according to the third embodiment.

<Step S241> The decoder 240a selects m values from among the n values (indicating the n row numbers) of the variable i which are outputted in step S222 in FIG. 20 and contained in the encoded data obtained after expansion, and reads in all the sets of redundant data which contain the selected values of the variable indicating the m row numbers. Then, the decoder 240a restores from the encoding matrix A the m bit series corresponding to the m row numbers indicated by the selected m values of the variable i.

In the case where the m bit series per se, instead of the values indicating the m row numbers, are contained in the above sets of redundant data, the decoder 240a can directly acquire the m bit series from the sets of redundant data without referring to the encoding matrix A.

<Step S242> The decoder 240a produces a matrix Ad (indicated as "$Ad_{mm}$," in FIG. 21) which has m rows and m columns and in which the values of the bits in the restored m bit series are arrayed in a matrix arrangement. In addition, the decoder 240a produces a matrix Pd (indicated as "$Pd_m$" in FIG. 21) which has m rows and in which the values of the bits in the m-bit series pm extracted from the sets of redundant data are arrayed in a matrix arrangement. Specifically, in the matrix Pd, the values of the bits in the m-bit series pm extracted from the sets of redundant data containing each value of the variable i (indicating an identical row number) are arrayed along a row in the matrix Pd, and m m-bit series pm which are produced on the basis of an identical group of m data pieces and correspond to different row numbers are arrayed along the column direction.

<Step S243> The decoder 240a performs an operation for transforming the matrix Ad into an upper triangle matrix, and performs the same operation as the above operation for transforming the matrix Ad into an upper triangle matrix, on the matrix Pd. The operation performed on the matrix Pd in step S243 is identical to the operation performed on the matrix Dxor in step S113 in FIG. 12.

<Step S244> The decoder 240a determines whether or not the transformation of the matrix Ad into an upper triangle matrix is achieved. When yes is determined in step S244, the operation goes to step S249. When no is determined in step S244, the operation goes to step S245.

<Step S245> The decoder 240a determines whether or not one or more of the n row numbers remain unselected. When yes is determined in step S245, the operation goes to step S246. When all the n row numbers are already selected, the operation goes to step S251.

<Step S246> The decoder 240a selects the sets of redundant data containing an unselected row number, and restores the bit series corresponding to the row number in the encoding matrix A.

<Step S247> The decoder 240a adds the bit series restored in step S246 to the matrix Ad of which the transformation into an upper triangle matrix is not yet achieved, so that the values of the bits in the bit series restored in step S246 are arranged in an additional row in the bit-series-added matrix Ad. Then, the decoder 240a performs an operation for transforming the bit-series-added matrix Ad into an upper triangle matrix. At this time, the decoder 240a adds all the m-bit series pm extracted from the sets of redundant data selected in step S246, to the matrix Pd on which the operation to be performed has not yet been completed, so that the values of the bits in all the m-bit series pm extracted from the sets of redundant data selected in step S246 are arranged in an additional row of the row-added matrix Pd. Then, the decoder 240a performs an operation identical to the operation performed on the matrix Ad, on the row-added matrix Pd. The operation performed on the row-added matrix Pd in step S247 is identical to the operation performed on the data-added matrix Dxor in step S117 in FIG. 12.

<Step S248> The decoder 240a determines whether or not transformation, into an upper triangle matrix, of a submatrix of the (bit-series-added) matrix Ad having m rows among the rows of the (bit-series-added) matrix Ad is achieved. When yes is determined in step S248, the operation goes to step S249. When no is determined in step S248, the operation goes to step S245.

<Step S249> The decoder 240a performs an operation for transforming the matrix Ad into an identity matrix, and performs an operation identical to the operation performed on the matrix Ad, on the matrix Pd. The operation performed on the matrix Pd in step S249 is identical to the operation performed on the matrix Dxor in step S119 in FIG. 12.

<Step S250> The decoder 240a outputs as data pieces bit series in m rows, corresponding to the identity matrix in the matrix Ad, of the matrix Pd on which the operation in step S249 is performed.

<Step S251> The decoder 240a determines that the decoder 240a fails in decoding, and for example, makes the display device display the decoding failure.

In the above processing of FIG. 21, the m-bit series corresponding to all the data pieces are contained in the matrix Ad, and concurrently undergo the operation for obtaining the data pieces. Alternatively, the processing of FIG. 21 may be performed on each data piece or on one or more m-bit series corresponding to a plurality of data pieces.

In the case where the encoder 120a outputs as the redundant data the m-bit series $pm_0, pm_1, \ldots, pm_{j-1}$ corresponding to all the data pieces after output of each value of the variable i (which indicates the row number of the bit series $a_i$ in the encoding matrix A) in step S222 in FIG. 20 as mentioned before, the information processing apparatus 200a on the receiver side operates as follows. That is, the receiver 220 extracts the value of the variable i and the m-bit series from the received packets, and the expander 230 expands each of the m-bit series, so that the m-bit series $pm_0, pm_1, \ldots, pm_{j-1}$ corresponding to all the data pieces and each value of the variable i are restored. In the processing for decoding, the values of the bits in each bit series $a_i$ of the bit series $a_0, a_1, \ldots, a_{n-1}$ indicated by a row number (variable i) are arrayed in the matrix Ad, and the solutions calculated by using each bit series $a_i$ and all the data pieces are arrayed in the matrix Pd, where each bit series $a_i$ and the solutions corresponding to the bit series $a_i$ are arranged in identical rows in the matrix Ad and the matrix Pd. Then, an operation for transforming the matrix Ad into an identity matrix is performed on the matrix Ad and the matrix Pd.

3.6 Advantages of Third Embodiment

According to the third embodiment explained above, in many cases, the information processing apparatus 200a explained above can restore the data to be transmitted, by expanding and decoding received data even when loss of data occurs in received data.

Further, according to the third embodiment, the information processing apparatus 100a on the transmitter side compresses the encoded data obtained by the above processing for encoding, by using the encoding bit series (e.g., the encoding matrix A) used in the processing for encoding. In addition, the information processing apparatus 200*a* on the receiver side expands the received data by using the same encoding bit series (e.g., the encoding matrix A), and then performs the processing for decoding explained before. Therefore, it is possible to reduce the volume of data transmitted between the information processing apparatuses 100*a* and 200*a*, and increase the substantial transmission rate.

4. Recording Medium Storing Program

The processing functions according to the embodiments explained above can be realized by a computer. In this case, a program describing details of processing for realizing the functions which each of the information processing apparatuses should have is provided. When a computer executes the program, the processing functions of one of the image processing apparatuses can be realized on the computer.

The program describing the details of the processing can be stored in a non-transitory recording medium which can be read by the computer. The non-transitory recording medium may be a magnetic recording device, an optical disk, an optical magnetic recording medium, a semiconductor memory, or the like.

In order to put the program into the market, for example, it is possible to sell a portable recording medium such as an optical disk in which the program is recorded. Alternatively, it is possible to store the program in a storage device belonging to a server computer, and transfer the program to another computer through a network.

The computer which should execute the program stores the program in a storage device belonging to the computer, where the program is originally recorded in, for example, a portable recording medium, or is initially transferred from the server computer. The computer which should execute the program reads the program from the storage device, and performs processing in accordance with the program. Alternatively, the computer which should execute the program may directly read the program from the portable recording medium for performing processing in accordance with the program. Further alternatively, the computer which should execute the program can sequentially execute processing in accordance with each portion of the program every time the portion of the program is transferred from the server computer.

When the computer-readable recording medium storing the data encoding program and/or the data decoding program according to the present invention is used, the volume of encoded data can be efficiently reduced.

5. Additional Matters

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions and alterations could be made hereto without departing from the spirit and scope of the invention.

What is claimed is:

1. A non-transitory computer-readable recording medium which stores a data encoding program to be executed by a computer, said data encoding program makes the computer execute a procedure, the procedure comprising:
    obtaining encoded data on the basis of data to be encoded and unit bit series which are obtained from an encoding bit series;
    searching said encoding bit series for a first bit series identical to a portion of said encoded data; and
    substituting the portion of the encoded data with a second bit series, where the second bit series is a combination of a leading code and position information, the leading code indicates a leading position of a substitution range, and the position information indicates a position of the first bit series in the encoding bit series.

2. The non-transitory computer-readable recording medium according to claim 1, wherein in the case where said encoded data other than said portion contains a third bit series which is identical to said leading code, in said substituting, the third bit series is substituted with a discrimination code realized by a fourth bit series different from the third bit series.

3. The non-transitory computer-readable recording medium according to claim 2, wherein said leading code and said discrimination code contain a common partial bit series beginning from a leading bit and a bit following the common partial bit series, the bit following the common partial bit in each of the leading code and the discrimination code has a different value, and the common partial bit series is substituted with the discrimination code in said substituting in the case where said encoded data other than said portion contains a bit series identical to the common partial bit series.

4. The non-transitory computer-readable recording medium according to claim 1, wherein the number of bits constituting said first bit series is variable, said portion of the encoded data is substituted with a third bit series in said substituting, and the third bit series is a combination of said leading code, said position information, and length information indicating a length of said first bit series.

5. The non-transitory computer-readable recording medium according to claim 1, wherein said encoding bit series is prepared as an encoding matrix in which each of said unit bit series is arrayed in a row, said encoding matrix is searched along a variable direction in said searching, said portion of the encoded data is substituted with a third bit series in said substituting, and the third bit series is a combination of said leading code, said position information, and direction information indicating a direction along which said encoding matrix is searched.

6. The non-transitory computer-readable recording medium according to claim 1, wherein, in said obtaining, said unit bit series are cut out from said encoding bit series and each have an identical number of bits, calculations in which data pieces and ones of the unit bit series are combined are performed for producing said encoded data, the encoded data contains results of the calculations and unit-bit-series information items, the unit-bit-series information items are the unit bit series used in the calculations or unit-bit-series position indicators indicating positions, in the encoding bit series, of the unit bit series used in the calculations, the data pieces are produced by division of said data to be encoded and each have a predetermined number of bits, and the results of the calculations are respectively contained in the calculation-result containing regions in the encoded data; and said searching and said substituting are performed on each of the calculation-result containing regions.

7. The non-transitory computer-readable recording medium according to claim 6, said procedure further comprising:
    including each of said calculation-result containing regions in a packet to be transmitted.

8. The non-transitory computer-readable recording medium according to claim 1, wherein, in said obtaining, said unit bit series are n unit bit series each having m bits (where n and m are integers satisfying n≧m, and m is equal to or greater than one), said data to be encoded is divided into divided-data groups each containing m data pieces, bits in each of the n unit bit series are brought into correspondence with the m data pieces in each of the divided-data groups, one or more of the m data pieces in said each of the divided-data groups, respectively corresponding to one or more "1" bits in each of the n unit bit series, are selected, an exclusive OR calculation of the one or more of the m data pieces is performed for each of the n unit bit series and each of the divided-data groups, said encoded data contains, for said each of the n unit bit series and said each of the divided-data groups, a result of the exclusive OR calculation and a unit-bit-series information item which is one of the unit bit series used in the exclusive OR calculation or a unit-bit-series position indicator indicating a position, in said encoding bit series, of said one of the unit bit series used in the exclusive OR calculation, and said encoded data is contained in data regions each of which contains a result of at least one exclusive OR calculation; and said searching is performed on each of the data regions.

9. The non-transitory computer-readable recording medium according to claim 1, wherein, in said obtaining, said data to be encoded is divided into data pieces each having m bits (where m is an integer equal to or greater than one) $b_0, b_1, b_2, \ldots, b_{m-1}$, said unit bit series are n unit bit series each having bits $a_{i0}, a_{i1}, a_{i2}, \ldots, a_{i(m-1)}$ (where n is an integer equal to or greater than m, and i is an integer satisfying 0≦i≦n−1), n solutions $p_i$ (0≦i≦n−1) of a set of simultaneous Boolean equations $$b_0 a_{i0} + b_1 a_{i1} + b_2 a_{i2} + \ldots + b_{3-1} a_{i(m-1)} = p_i (0 \leq i \leq n-1)$$

are obtained by substituting each of the data pieces having bits $b_{i0}, b_{i1}, \ldots, b_{i(m-1)}$ and the n unit bit series $a_{i0}, a_{i1}, a_{i2}, \ldots, a_{i(m-1)}$ into the set of simultaneous Boolean equations, and said encoded data contains all solutions of the set of simultaneous Boolean equations obtained from all the data pieces corresponding to the data to be encoded and unit-bit-series information items, the unit-bit-series information items are the unit bit series used for obtaining all the solutions corresponding to the data to be encoded or unit-bit-series position indicators indicating positions, in said encoding bit series, of the unit bit series used for obtaining all the solutions corresponding to the data to be encoded, and said encoded data is contained in data regions each of which contains at least a predetermined number of ones of all the solutions corresponding to the data to be encoded; and said searching is performed on each of the data regions.

10. A non-transitory computer-readable recording medium which stores a data decoding program to be executed by a computer, said data decoding program makes the computer execute a procedure, the procedure comprising:
    detecting position information from a substitution range in compressed and encoded data which is inputted into the computer, when the leading code is detected in the compressed and encoded data, and the leading code is located at a leading position of the substitution range and indicates the leading position;
    extracting a substitution bit series from a position in an encoding bit series indicated by said position information;
    substituting a portion of said compressed and encoded data in said substitution range with said substitution bit series so as to restore encoded data; and
    restoring original data from said encoded data and unit bit series obtained from said encoding bit series.

11. The non-transitory computer-readable recording medium according to claim 10, wherein when a discrimination code which is a predetermined bit series different from said leading code is detected in said compressed and encoded data, the discrimination code is substituted with the leading code in said substituting.

12. The non-transitory computer-readable recording medium according to claim 11, wherein said leading code and said discrimination code contain a common partial bit series beginning from a leading bit and a bit following the common partial bit series, and the bit following common partial bit in each of the leading code and the discrimination code has a different value.

13. The non-transitory computer-readable recording medium according to claim 10, wherein length information, as well as said position information, is detected from said substitution range in said detecting, and a bit series being located in said position in the encoding bit series indicated by said position information and having a bit length indicated by the length information is extracted as said substitution bit series in said substituting.

14. The non-transitory computer-readable recording medium according to claim 10, wherein said encoding bit series is prepared as an encoding matrix in which each of said unit bit series is arrayed in a row, direction information, as well as said position information, is detected from said substitution range in said detecting, and a bit series being located in a position in the encoding matrix indicated by said position information and being arrayed along a direction indicated by the length information is extracted as said substitution bit series in said substituting.

15. The non-transitory computer-readable recording medium according to claim 10, wherein in said restoring, unit-bit-series information items are extracted from said encoded data, calculation results, which are obtained when the original data is encoded on the basis of the unit bit series and data pieces being produced by division of the original data and grouped into groups of one or more data pieces and each having a predetermined number of bits, are extracted from the encoded data, and each group of one or more data pieces is restored by using part of the calculation results which are obtained on the basis of said each group of one or more data pieces and the unit bit series based on said unit-bit-series information items, where the unit-bit-series information items are the unit bit series per se or unit-bit-series position indicators indicating positions of the unit bit series in the encoding bit series.

16. The non-transitory computer-readable recording medium according to claim 15, wherein said compressed and encoded data inputted into the computer includes calculation-result containing regions each of which contains a part of said calculation results obtained on the basis of one of said unit bit series and at least one of said data pieces produced by the division of the original data, the compressed and encoded data is inputted into the computer in packets, said process further comprises extracting, from each of the packets inputted into the computer, data contained in one of the calculation-result containing regions, and an operation of detecting said leading code is performed for each of the calculation-result containing regions in said detecting.

17. The non-transitory computer-readable recording medium according to claim 15, wherein said unit bit series each have a length of m bits (where m is an integer equal to or greater than one); and in said restoring, values of bits of m unit bit series based on m unit-bit-series information items which are extracted from said encoded data are arrayed in a matrix arrangement in a first matrix, values of bits of m calculation results obtained on the basis of said each group of one or more data pieces and the m unit bit series are arrayed in a matrix arrangement in a second matrix, a first operation for transforming the first matrix into an identity matrix is performed on the first matrix, and said each group of one or more data pieces is restored by performing on the second matrix a second operation identical to the first operation.

18. The non-transitory computer-readable recording medium according to claim 15, wherein, each of said data pieces produced by division of the original data has m bits (where m is an integer equal to or greater than one) $b_0, b_1, b_2, \ldots, b_{m-1}$, m unit bit series $a_i$ ($0 \leq i \leq m-1$) indicated by m unit-bit-series information items each have m bits $a_{i0}, a_{i1}, a_{i2}, \ldots, a_{i(m-1)}$, and said each of said data pieces is restored, in said restoring, by substituting the m unit bit series $a_i$ and m solutions $p_i$ ($0 \leq i \leq m-1$) of a set of simultaneous Boolean equations $$b_0 a_{i0} + b_1 a_{i1} + b_2 a_{i2} + \ldots + b_{m-1} a_{i(m-1)} = p_i (0 \leq i \leq m-1)$$

into the set of simultaneous Boolean equations, where the m solutions pi are obtained on the basis of said each of the data pieces and the m unit bit series.

19. A data encoding process comprising:

obtaining encoded data on the basis of data to be encoded and unit bit series which are obtained from an encoding bit series;

searching said encoding bit series for a first bit series identical to a portion of said encoded data; and substituting the portion of the encoded data with a second bit series, where the second bit series is a combination of a leading code and position information, the leading code indicates a leading position of a substitution range, and the position information indicates a position of the first bit series in the encoding bit series.

20. A data decoding process comprising:

detecting position information from a substitution range in compressed and encoded data which is inputted into the computer, when the leading code is detected in the compressed and encoded data, and the leading code is located at a leading position of the substitution range and indicates the leading position;

extracting a substitution bit series from a position in an encoding bit series indicated by said position information;

substituting a portion of said compressed and encoded data in said substitution range with said substitution bit series so as to restore encoded data; and restoring original data from said encoded data and unit bit series obtained from said encoding bit series.

* * * * *